US008614786B2

(12) United States Patent
Lansbergen et al.

(10) Patent No.: US 8,614,786 B2
(45) Date of Patent: Dec. 24, 2013

(54) ROBOT FOR IN-VACUUM USE

(75) Inventors: Robert Gabriël Maria Lansbergen, Schiedam (NL); George Hilary Harrold, Redding, CT (US); Matthew James Van Doren, Southbury, CT (US)

(73) Assignee: ASML Netherlands B.V., Veldhoven (NL)

( * ) Notice: Subject to any disclaimer, the term of this patent is extended or adjusted under 35 U.S.C. 154(b) by 363 days.

(21) Appl. No.: 12/936,465

(22) PCT Filed: Apr. 22, 2009

(86) PCT No.: PCT/EP2009/002916
§ 371 (c)(1),
(2), (4) Date: Oct. 5, 2010

(87) PCT Pub. No.: WO2009/130011
PCT Pub. Date: Oct. 29, 2009

(65) Prior Publication Data
US 2011/0032505 A1    Feb. 10, 2011

Related U.S. Application Data

(60) Provisional application No. 61/047,851, filed on Apr. 25, 2008.

(51) Int. Cl.
*G03B 27/60* (2006.01)
*G03B 27/58* (2006.01)

(52) U.S. Cl.
USPC .............................. 355/73; 355/72

(58) Field of Classification Search
USPC ................. 355/53, 72–76; 414/217
See application file for complete search history.

(56) References Cited

U.S. PATENT DOCUMENTS

| 4,717,265 A | 1/1988 | Shioda et al. |
| 4,836,048 A | 6/1989 | Torii et al. |

(Continued)

FOREIGN PATENT DOCUMENTS

| EP | 1 387 217 A2 | 2/2004 |
| EP | 1 813 989 A1 | 8/2007 |

(Continued)

OTHER PUBLICATIONS

International Preliminary Report on Patentability and Written Opinion directed to related International Patent Application No. PCT/EP2009/002916, mailed Nov. 4, 2010 from The International Bureau of WIPO, Geneva, Switzerland; 9 pages.

(Continued)

*Primary Examiner* — Hung Henry Nguyen
(74) *Attorney, Agent, or Firm* — Sterne, Kessler, Goldstein & Fox P.L.L.C.

(57) ABSTRACT

A robot positions a workpiece within a vacuum chamber of a lithographic apparatus. A first component of the robot is located within a vacuum chamber to position a workpiece along a translational axis. A shaft supports the first component such that an axis of symmetry of the shaft is perpendicular to the translational axis, and a second component rotates the shaft about the axis of symmetry and moves the shaft in a direction parallel to the axis of symmetry. The second component includes a gas bearing configured to introduce gas along a circumferential surface of the shaft and a scavenging seal configured to evacuate the gas introduced by the second component gas bearing. The robot substantially reduces, or eliminates, the out-gassing of hydrocarbon molecules in a range from about 0 to 200 a.m.u., thus rendering the robot suitable for use in extreme ultra-violet (EUV) photolithography applications.

18 Claims, 18 Drawing Sheets

(56) References Cited

U.S. PATENT DOCUMENTS

Figure 1A:
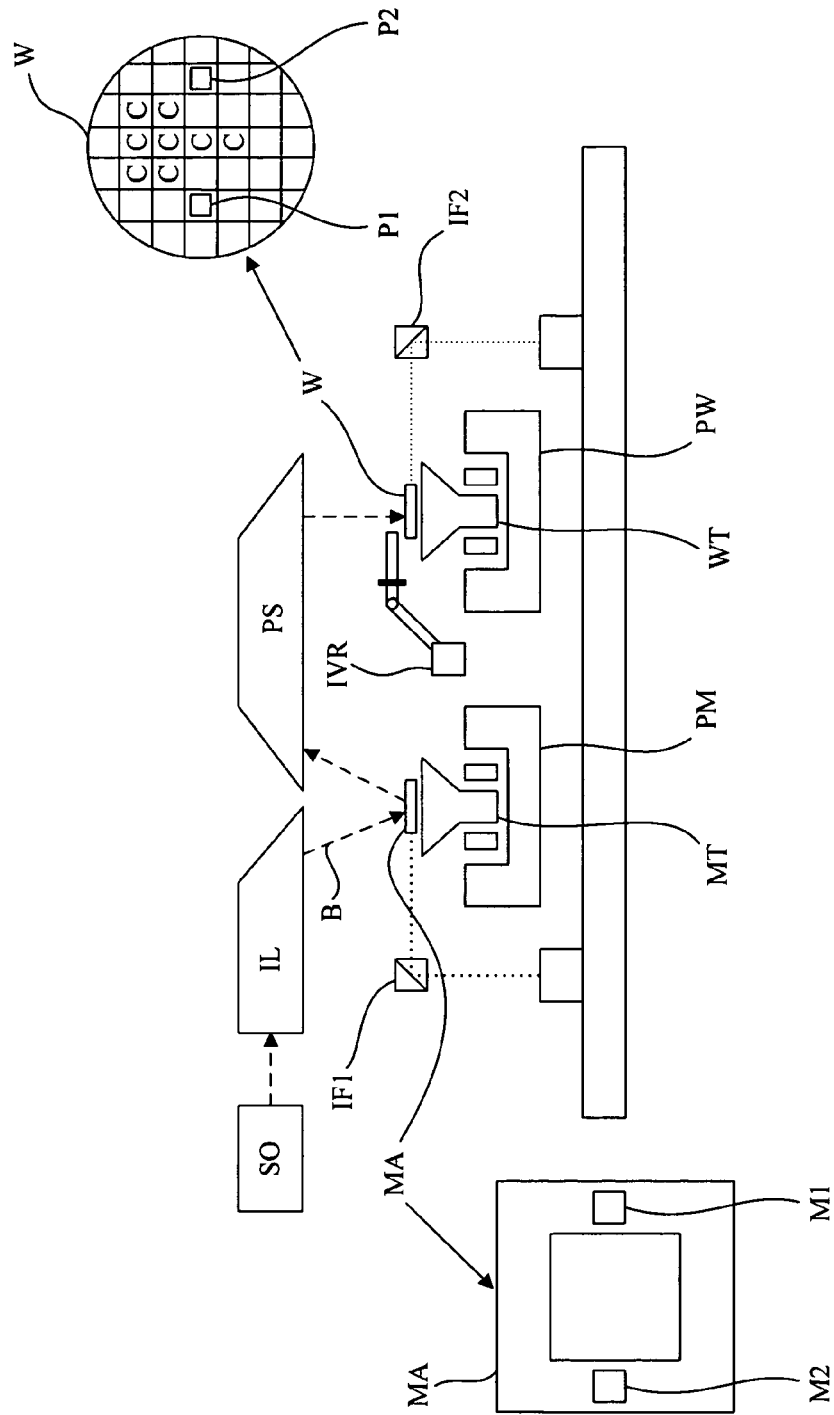

| | | | |
|---|---|---|---|
| 6,183,183 B1 | 2/2001 | Goodwin et al. | |
| 6,510,755 B1 | 1/2003 | Higuchi et al. | |
| 6,779,962 B2 * | 8/2004 | Poole | 414/744.2 |
| 6,925,355 B2 | 8/2005 | Mori et al. | |
| 7,543,867 B2 * | 6/2009 | Pun et al. | 279/3 |
| 7,802,920 B2 | 9/2010 | Sato et al. | |
| 7,959,403 B2 * | 6/2011 | van der Meulen | 414/805 |
| 2002/0079464 A1 | 6/2002 | Driessen et al. | |
| 2003/0068215 A1 | 4/2003 | Mori et al. | |
| 2003/0180126 A1 | 9/2003 | Poole | |

FOREIGN PATENT DOCUMENTS

| | | |
|---|---|---|
| JP | 61-256019 A | 11/1986 |
| JP | 62-120993 A | 6/1987 |
| JP | 62-297086 A | 12/1987 |
| JP | 2001-091681 A | 4/2001 |
| JP | 2002-107479 A | 4/2002 |
| JP | 2003-115527 A | 4/2003 |
| JP | 2005-221618 A | 8/2005 |
| JP | 2007-057745 A | 3/2007 |
| JP | 2007-132466 A | 5/2007 |
| TW | 435322 U | 5/2001 |
| WO | WO 99/20433 A1 | 4/1999 |

OTHER PUBLICATIONS

English-Language Translation of Office Action of the IPO directed to related Taiwanese Patent Application No. 098112335, mailed Jul. 9, 2012, from the Taiwan Intellectual Property Office; 5 pages.

International Search Report mailed Sep. 10, 2009 for International Application No. PCT/EP2009/002916, 4 pgs.

Trost, David, "Design and Analysis of Hydrostatic Gas Bearings for Vacuum Applications", ASPE Proceedings, Challenges at the Intersection of Precision Engineering and Vacuum Technology, May 2, 2006, Sheraton Station Square Hotel, Pittsburgh, Pennsylvania, 6 pgs.

Yoshimoto et al., "The Seal System in Aerostatic Journal Bearings for High Vacuum Chambers," Transaction of the ASME Journal of Tribology, Apr. 2004, Vo. 126, Issue 2, pp. 310-315.

English-Language Translation of Notice of Reasons for Rejection directed to related Japanese Patent Application No. 2011-505424, mailed May 20, 2013; 3 pages.

\* cited by examiner

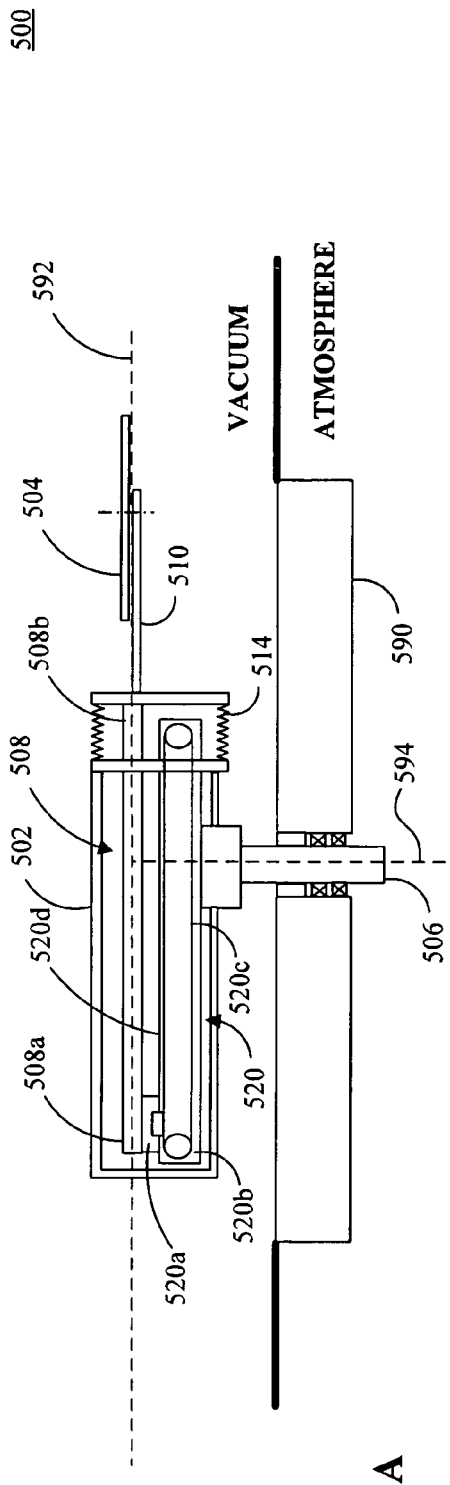
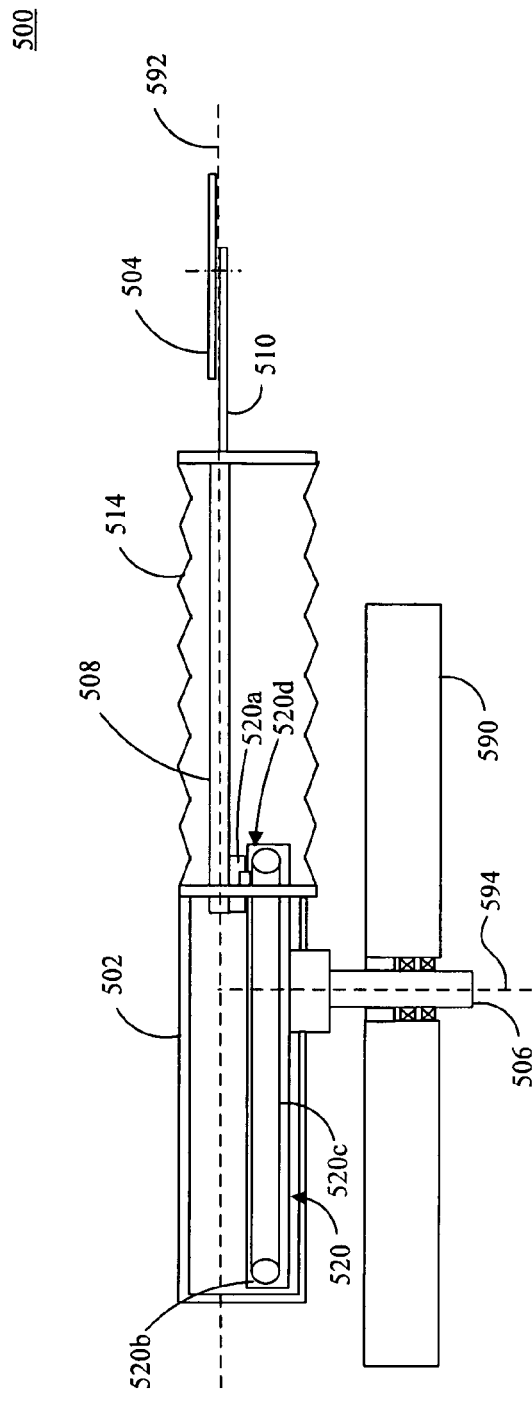
FIG. 5A
FIG. 5B

ROBOT FOR IN-VACUUM USE

BACKGROUND

1. Field of the Invention

The present invention relates to a robot for use in a vacuum chamber of a lithography apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, light is directed to a patterning device, which can be referred to as a mask, a reticle, an array of individually programmable or controllable elements (maskless), or the like. The patterning device can be used to generate a circuit pattern corresponding to an individual layer of an IC, flat panel display, or other device. This pattern can be transferred onto all or part of the substrate (e.g., a glass plate, a wafer, etc.), by imaging onto a layer of radiation-sensitive material (e.g., resist) provided on the substrate. The imaging can include the processing of light through a projection system, which can include optical components such as mirrors, lenses, beam splitters, and the like. Other components or devices can exist in a lithographic apparatus that can also contain optical components, such as a multi-field relay (MFR), which contains optical components to divide a radiation beam into a number of individual beams prior to patterning.

Many conventional lithographic apparatus, such as those used in extreme ultra-violet (EUV) photolithography applications, position various components of the apparatus within a vacuum chamber, including patterning devices, substrates or wafers, and additional optical components such as numerical apertures. In such a scenario, a robot can be placed inside the vacuum chamber to transport or move these components within the vacuum environment.

In general, conventional robots suited for use in atmospheric-pressure lithographic apparatus are ill-suited for used within a vacuum environment. These conventional robots often feature bearing assemblies lubricated with hydrocarbon compounds. In an effort to render these robots more amenable for in-vacuum use, the bearing assemblies and are often lubricated with specialized "vacuum grease" formulated to minimize out-gassing of molecules from 0 to 100 atomic mass units (a.m.u.). Further, conventional robots for in-vacuum use often feature ferro-fluidic seals, which also outgas hydrocarbon molecules into the vacuum environment.

Unfortunately, EUV photolithography applications, and some other applications, require minimal out-gassing of lubricant molecules from 0 to 200 a.m.u., as these molecules may condense onto sensitive EUV optics, severely limiting their lifetime For such applications, conventional robots utilizing "vacuum grease" and ferro-fluidic seals are unsuitable for use in vacuum due to out-gassing of large lubricant molecules, especially above the 100 a.m.u. threshold.

SUMMARY

Therefore, what is needed is a robot for in-vacuum use that ideally uses no hydrocarbon lubricants, or that substantially reduces out-gassing of hydrocarbon lubricants in a vacuum environment, thereby substantially obviating the drawbacks of the conventional systems.

In one embodiment, there is provided a robot for positioning a workpiece in a vacuum including a first component at least partially located within a vacuum chamber and configured to position a workpiece, which is located within the vacuum chamber, along a translational axis. The robot also includes a shaft configured to support the first component such that an axis of symmetry of the shaft is perpendicular to the translational axis. Further, a second component is positioned outside of the vacuum chamber and configured to rotate the shaft about the axis of symmetry and to move the shaft in a direction parallel to the axis of symmetry. The second component includes a gas bearing configured to introduce gas along a circumferential surface of the shaft and a scavenging seal configured to evacuate the gas introduced by the gas bearing.

In another embodiment, there is provided a lithographic apparatus that includes an illumination system configured to produce a beam of radiation, a patterning device located in a vacuum chamber and configured to pattern the beam of radiation, and a projection system configured to project the patterned beam onto a target portion of a substrate within the vacuum chamber. The lithographic apparatus also includes a robot for positioning a workpiece within the vacuum chamber. The robot has a first component at least partially located within a vacuum chamber and configured to position a workpiece, which is located within the vacuum chamber, along a translational axis. The robot also includes a shaft configured to support the first component such that an axis of symmetry of the shaft is perpendicular to the translational axis. Further, a second component is positioned outside of the vacuum chamber and configured to rotate the shaft about the axis of symmetry and to move the shaft in a direction parallel to the axis of symmetry. The second component includes a gas bearing configured to introduce gas along a circumferential surface of the shaft and a scavenging seal configured to evacuate the gas introduced by the gas bearing.

Further embodiments, features, and advantages of the present invention, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1B:
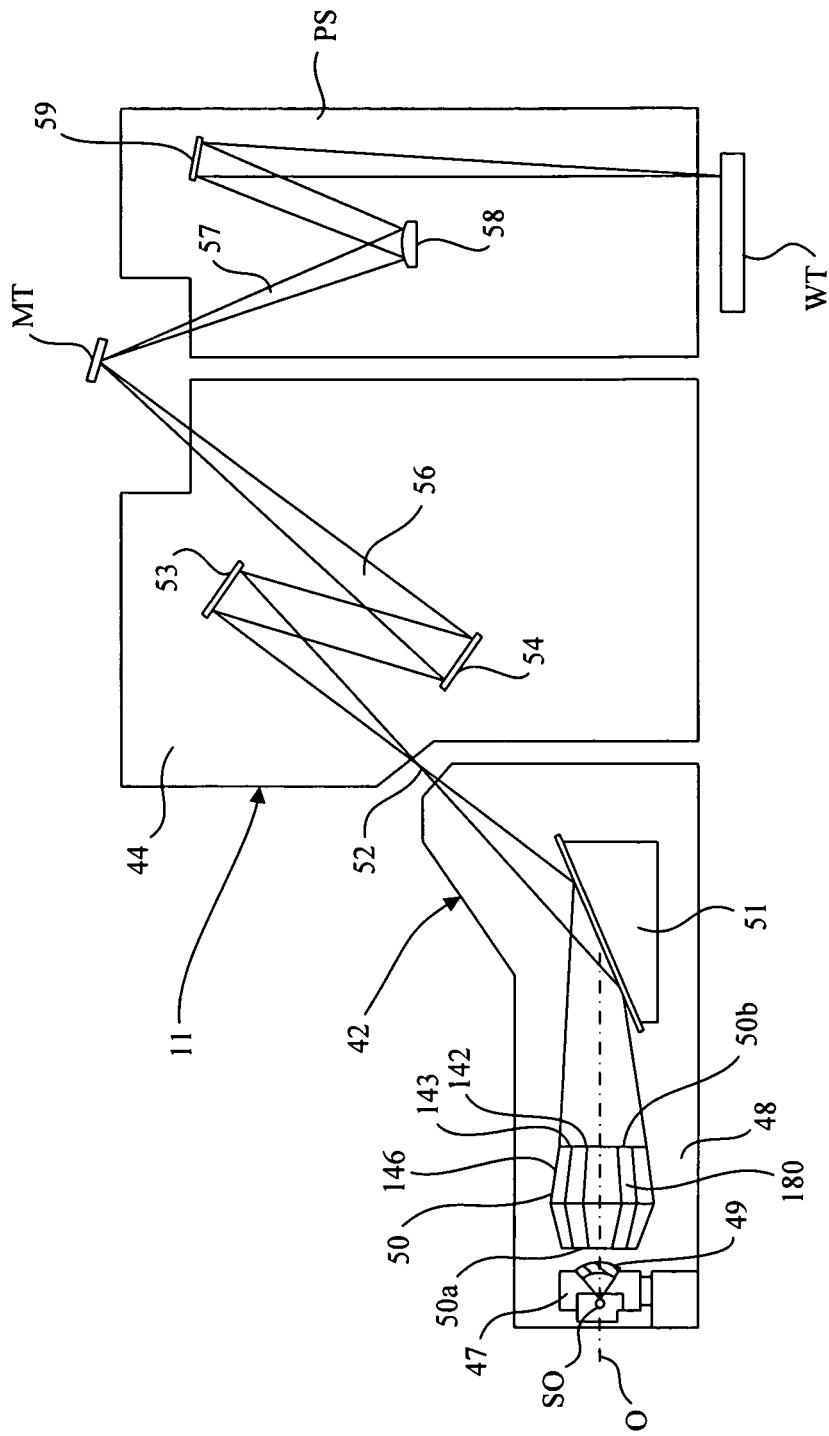

FIGS. 1A and 1B schematically depict a lithographic apparatus, according to embodiments of the present invention.

Figure 2:
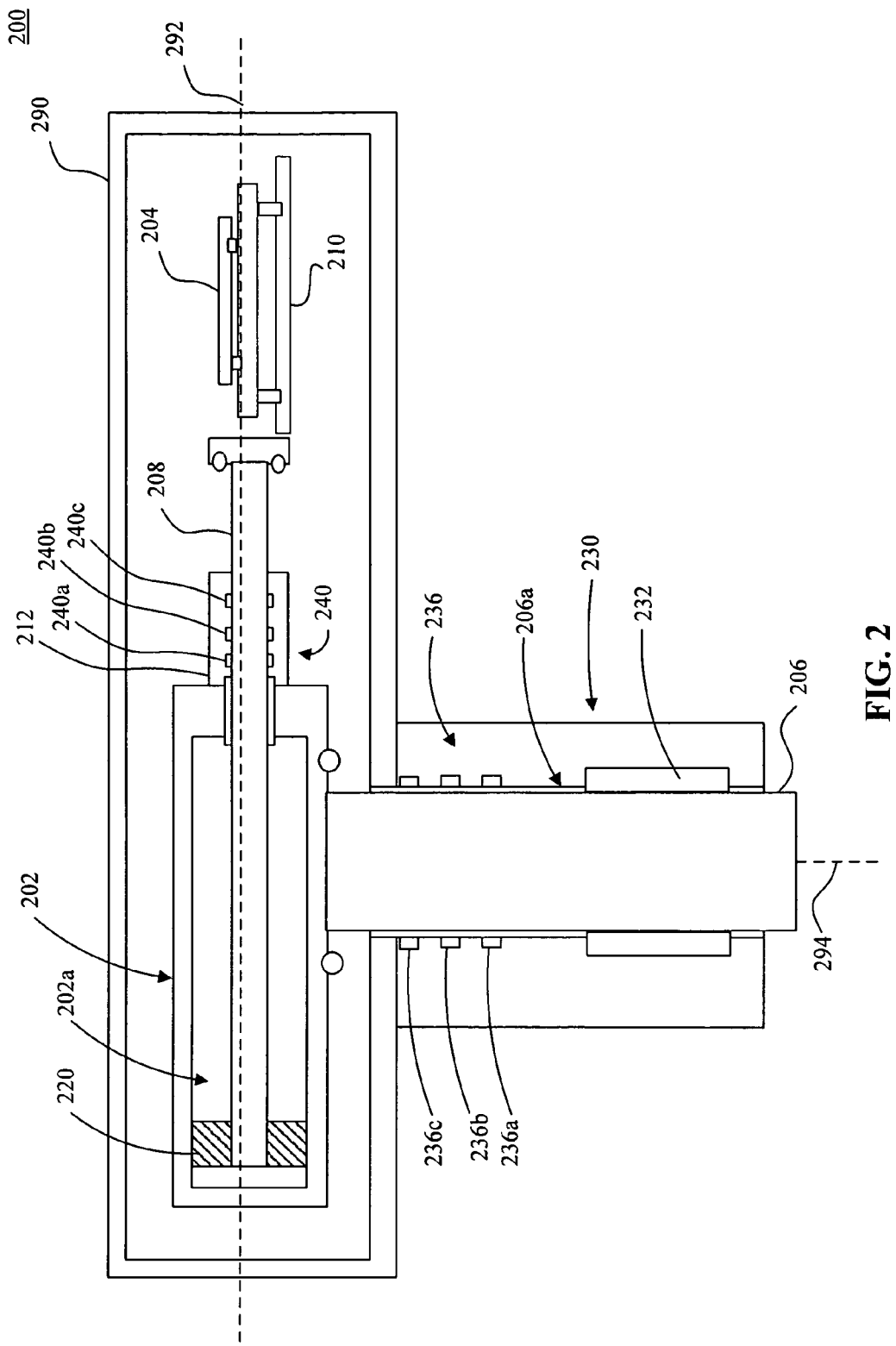

FIG. 2 schematically depicts an exemplary robot for positioning a workpiece in a vacuum, according to an embodiment of the present invention.

Figure 3A:
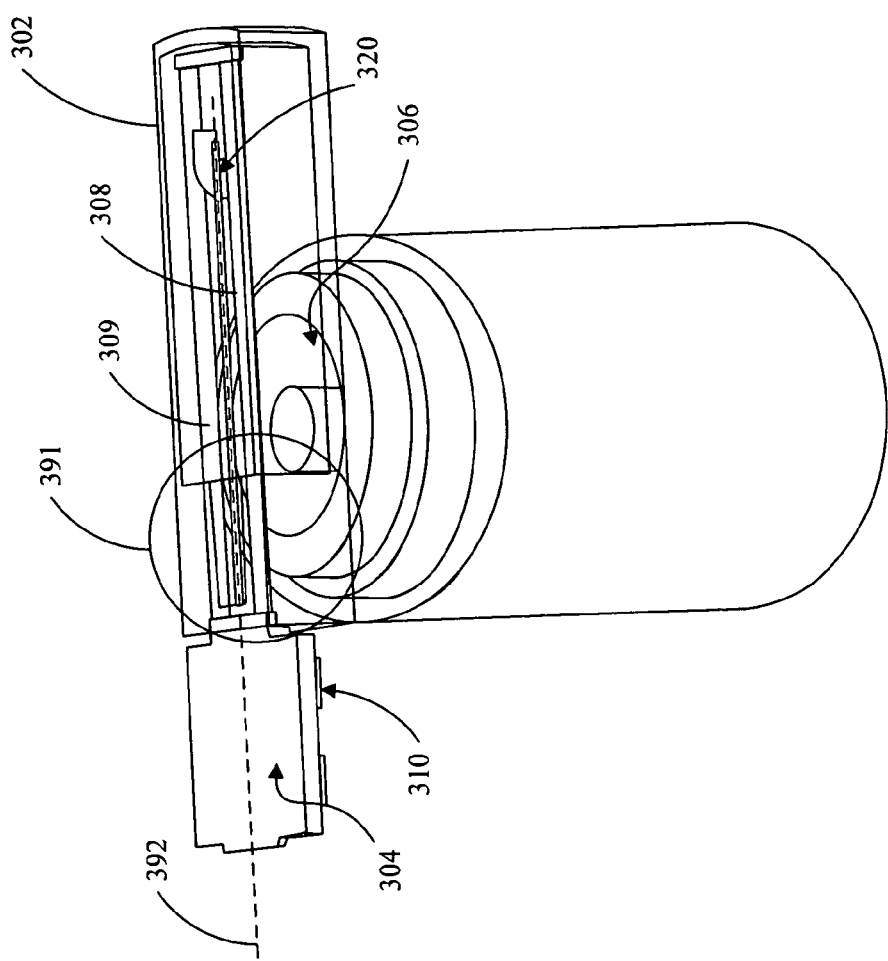
Figure 3B:
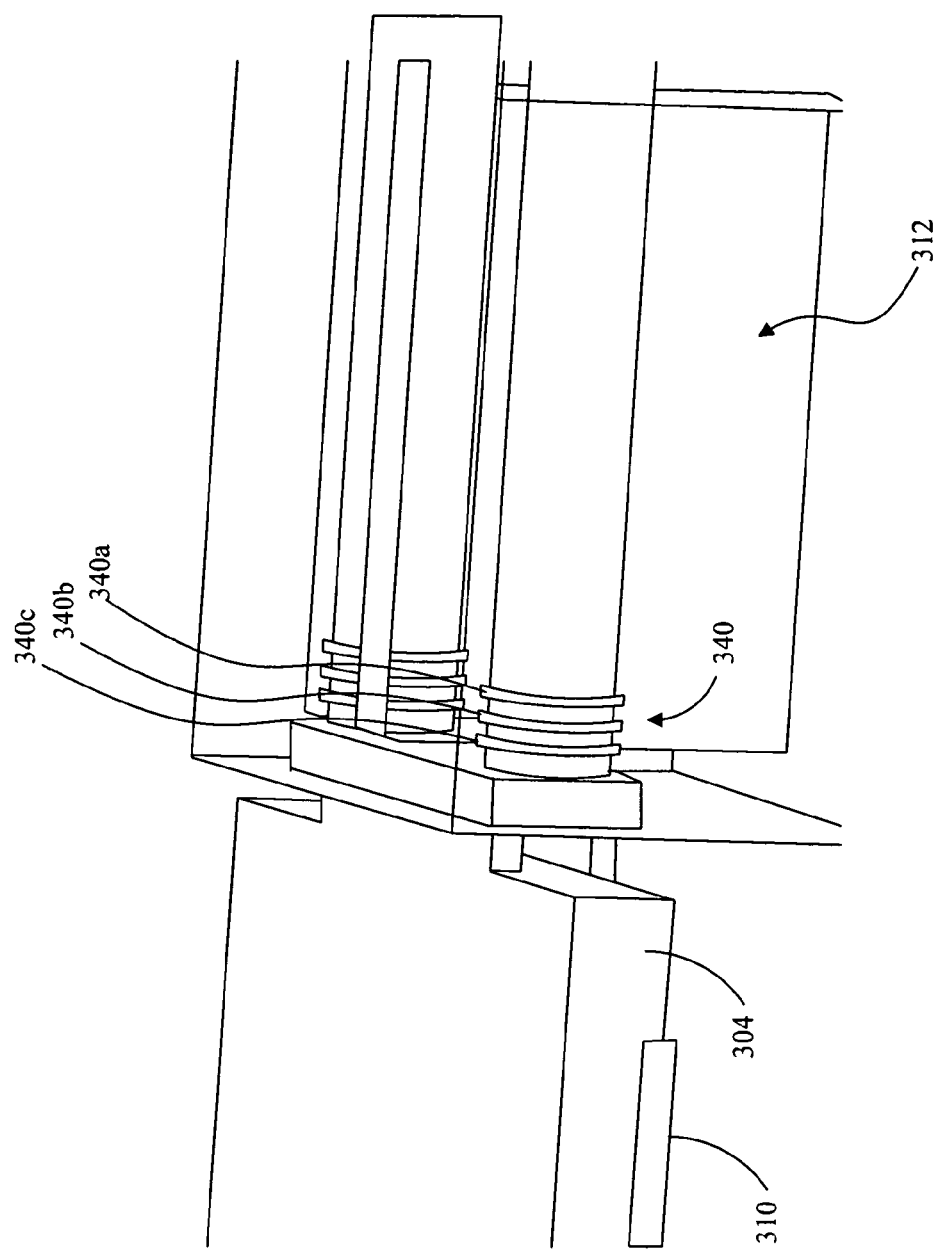

FIGS. 3A and 3B show additional features of the exemplary robot depicted in FIG. 2, according to an embodiment of the present invention.

Figure 4:
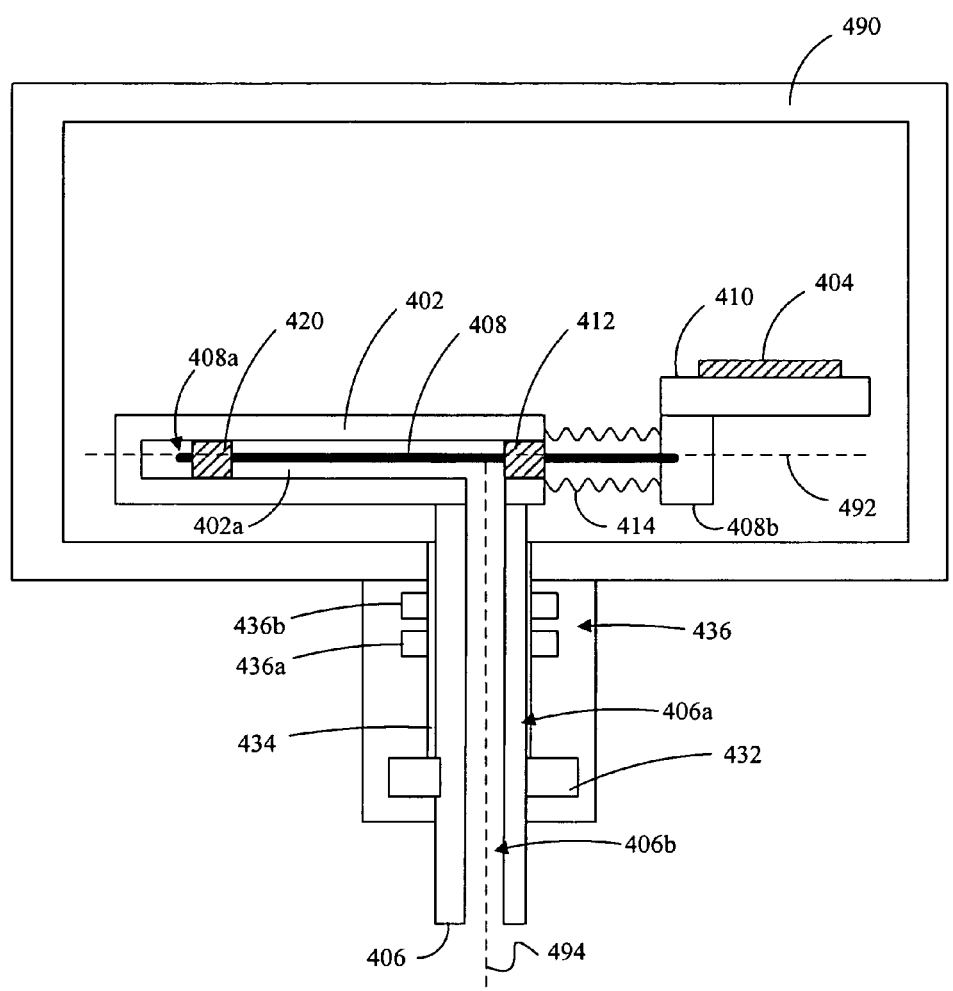

FIG. 4 schematically depicts an exemplary robot for positioning a workpiece in a vacuum, according to an embodiment of the present invention FIGS. 5A and 5B schematically depict additional features of the exemplary robot of FIG. 4, according to an embodiment of the present invention.

Figure 6:
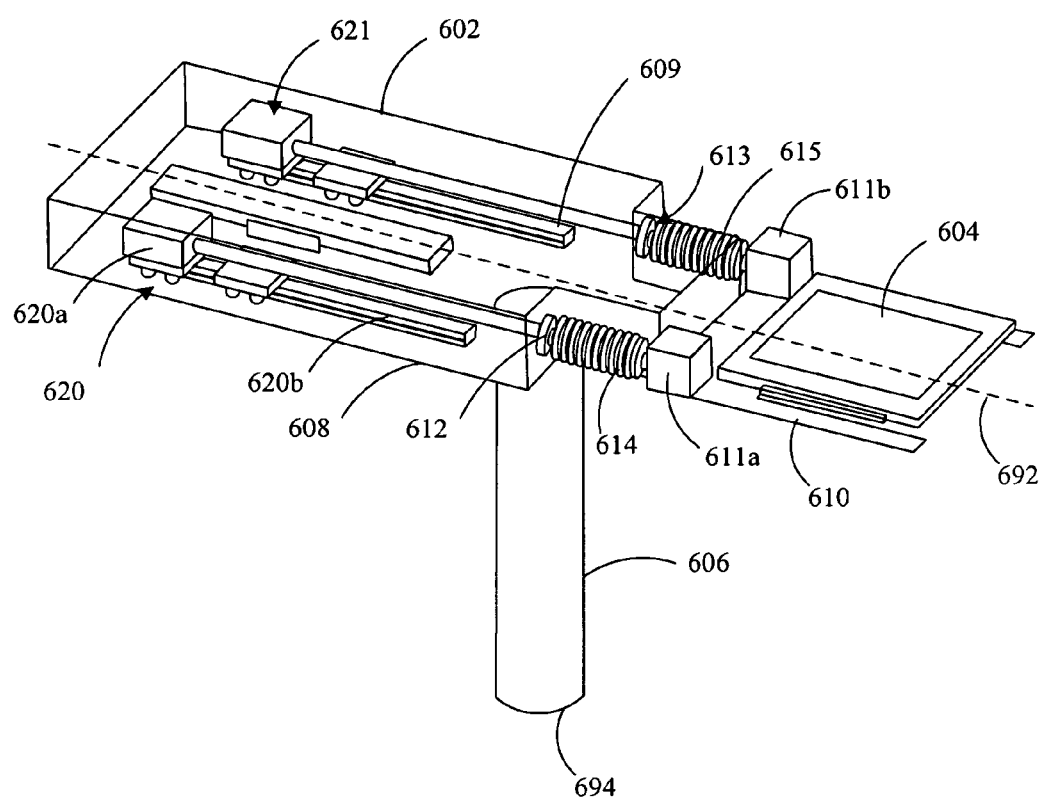

FIG. 6 is a perspective view of an exemplary robot for positioning a workpiece in a vacuum, according to an embodiment of the present invention.

Figure 7A:
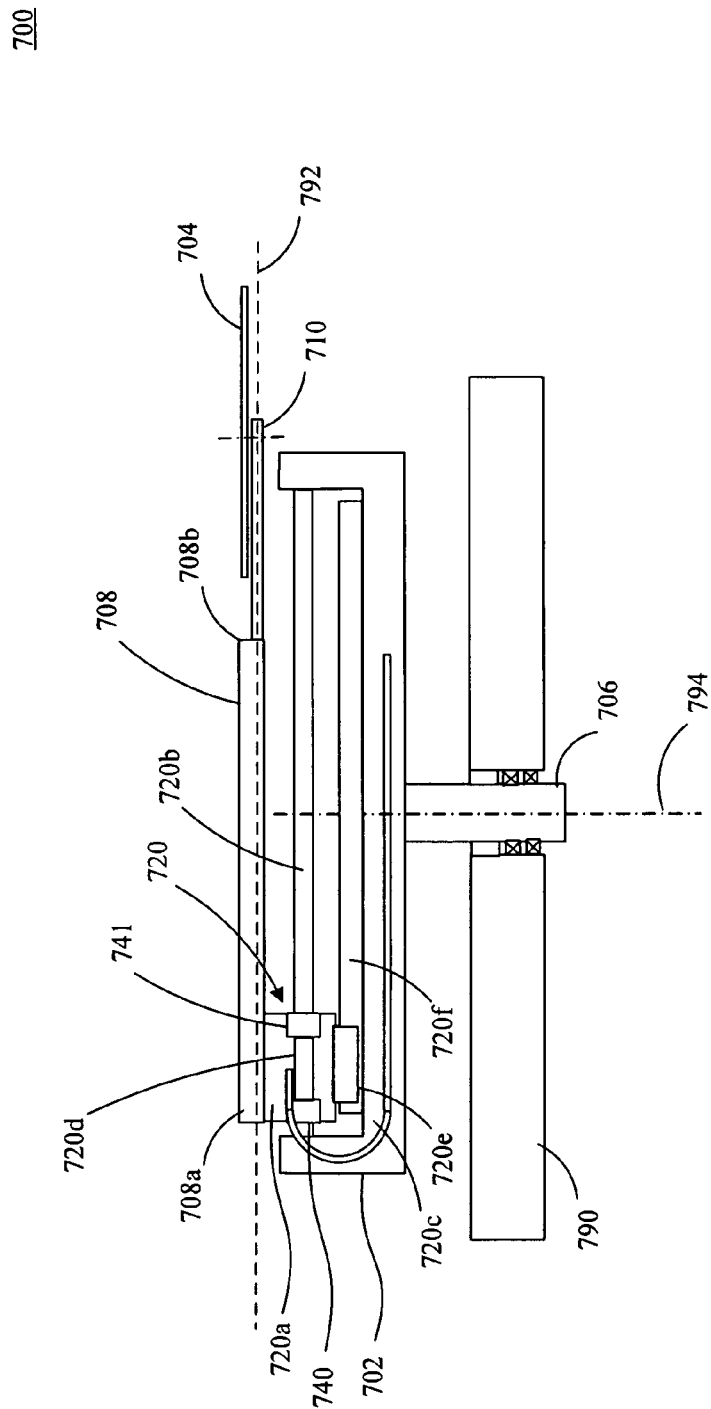
Figure 7B:
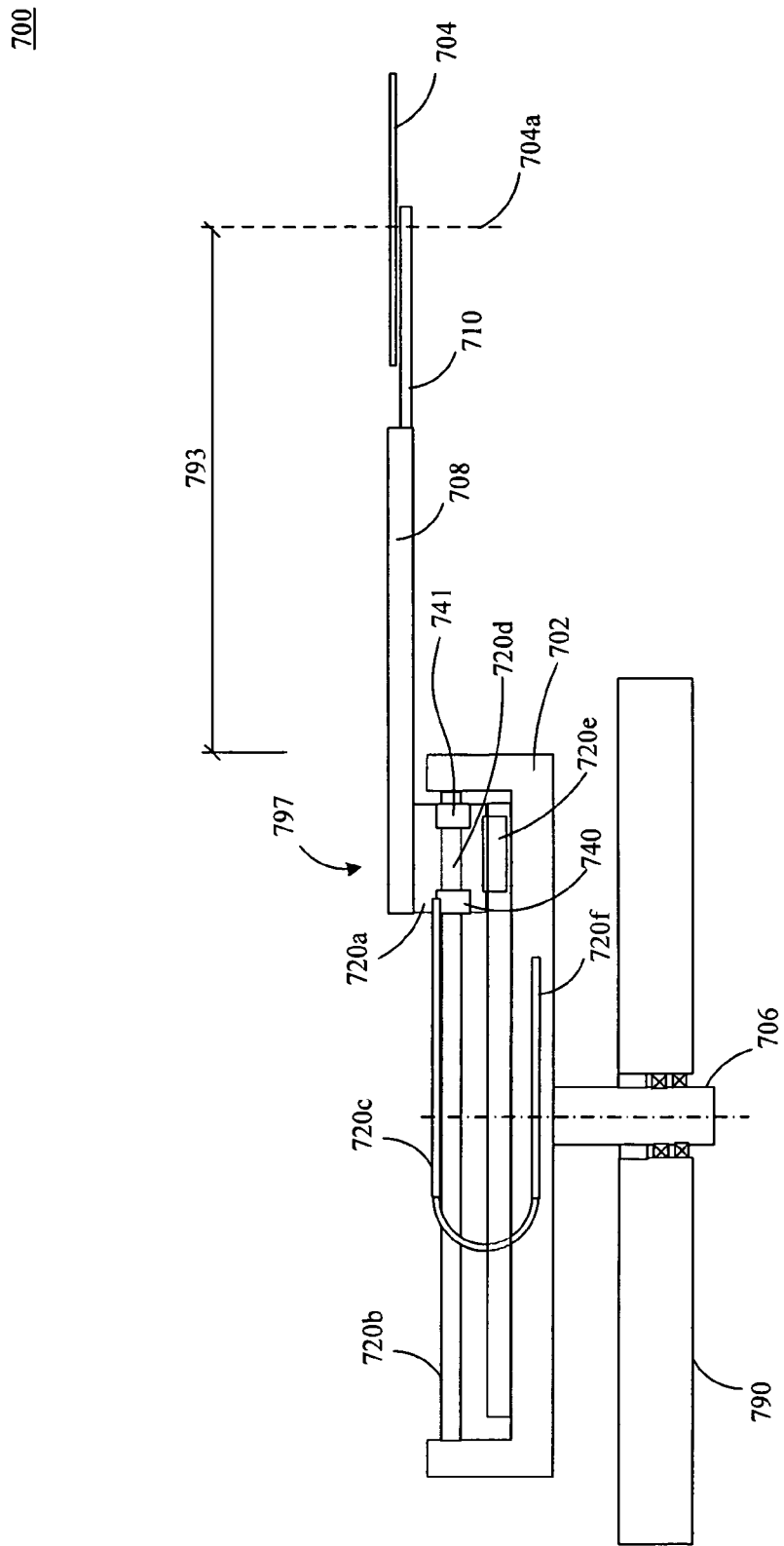

FIGS. 7A and 7B schematically depict an exemplary robot for positioning a workpiece in a vacuum, according to an embodiment of the present invention.

Figure 8:
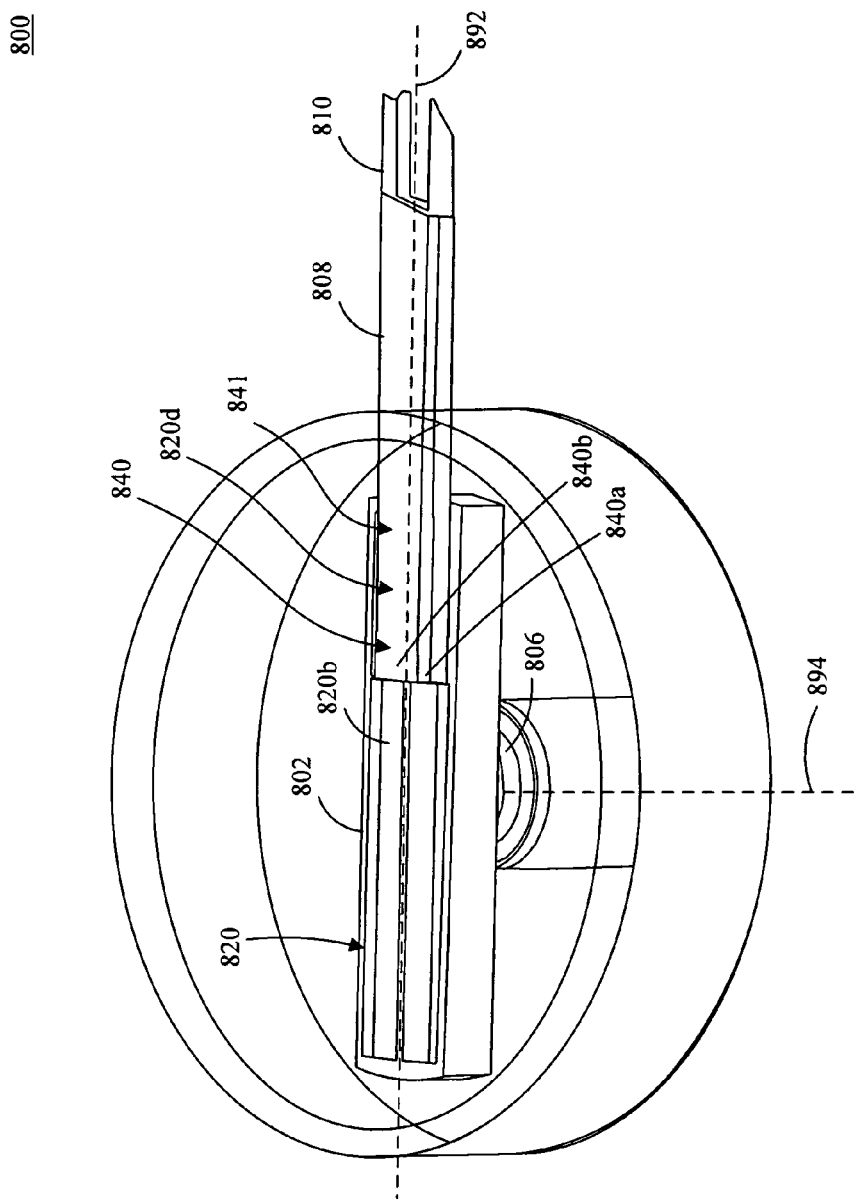

FIG. 8 shows additional features of the exemplary robot of FIGS. 7A and 7B, according to an embodiment of the present invention.

FIGS. 9A-9D schematically depict features of an exemplary slider and guide assembly that can be incorporated into a robot for positioning a workpiece in a vacuum, according to an embodiment of the present invention.

Figure 10:
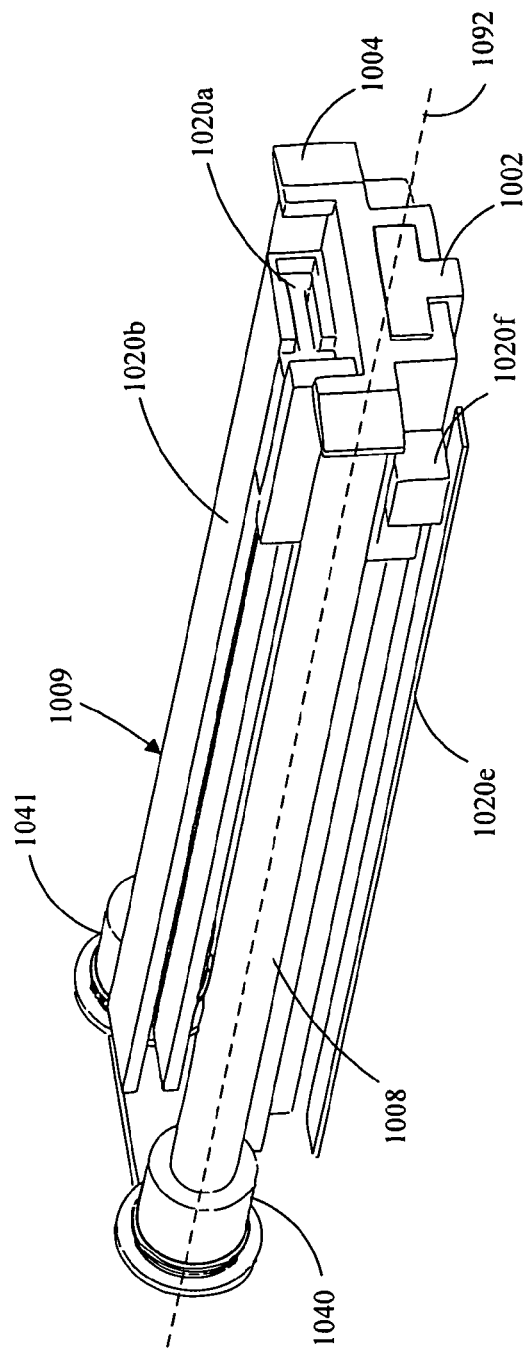

FIG. 10 schematically depicts an exemplary gas bearing assembly that may be incorporated into a robot for positioning a workpiece in a vacuum, according to an embodiment of the present invention.

Figure 11A:
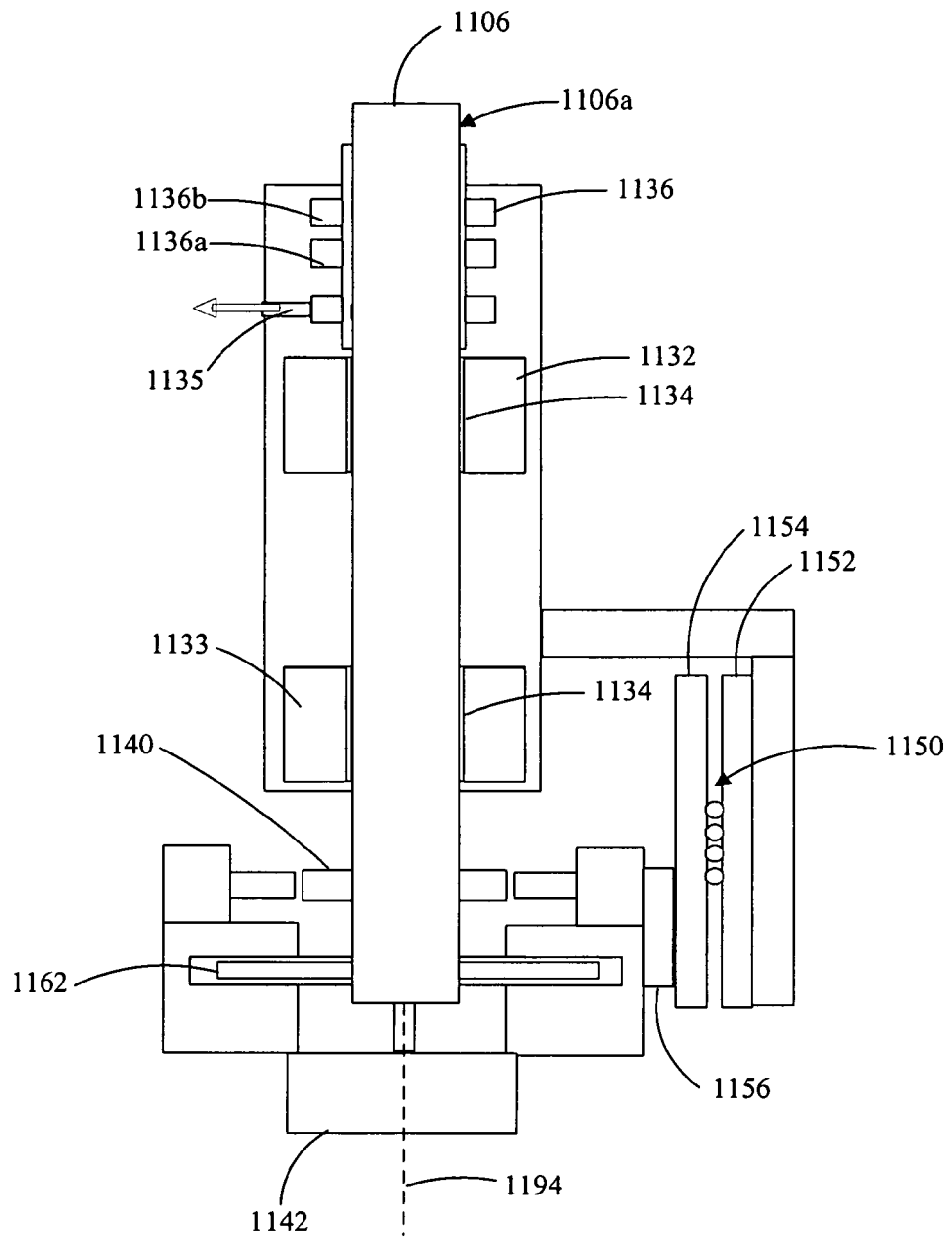
Figure 11B:
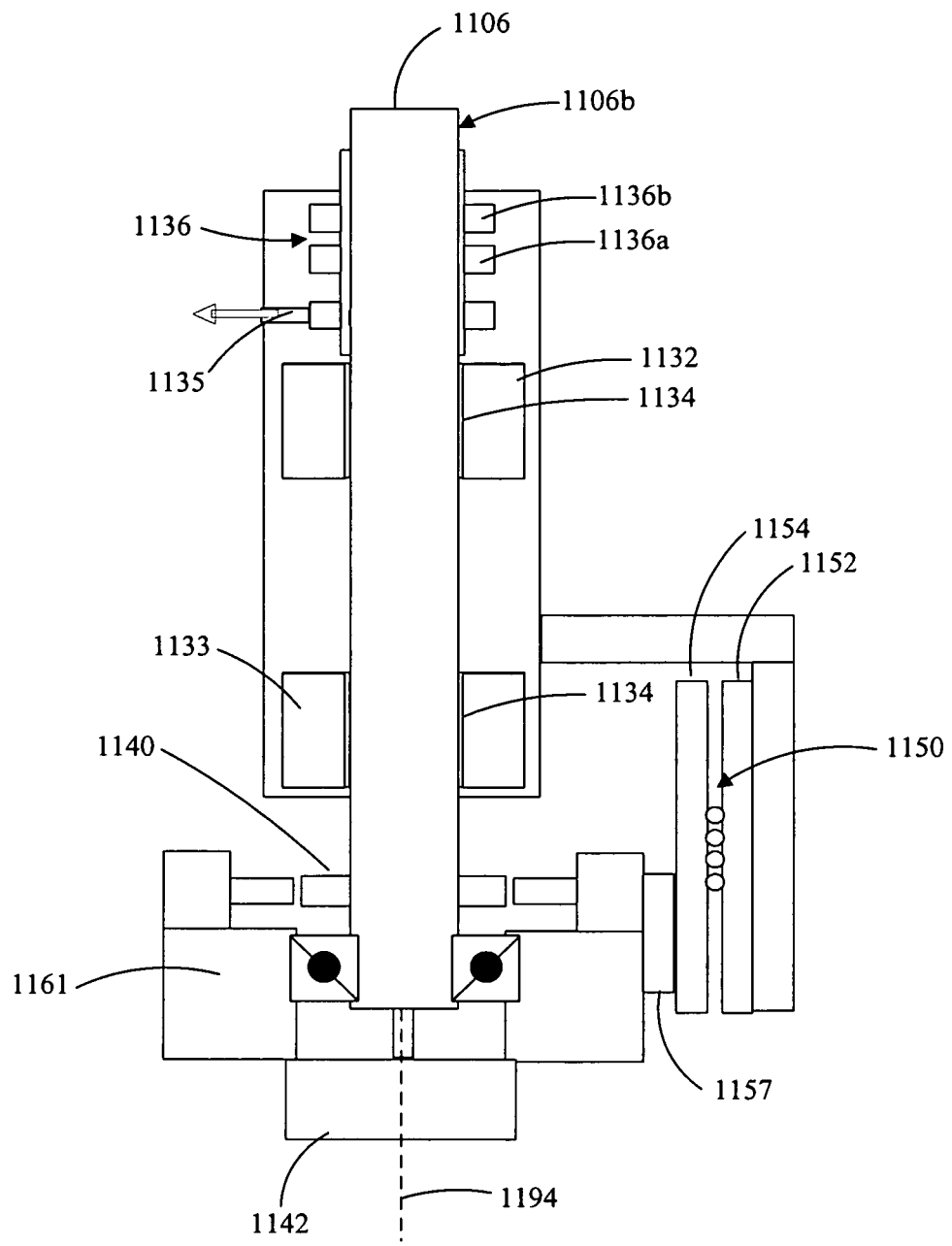
Figure 12:
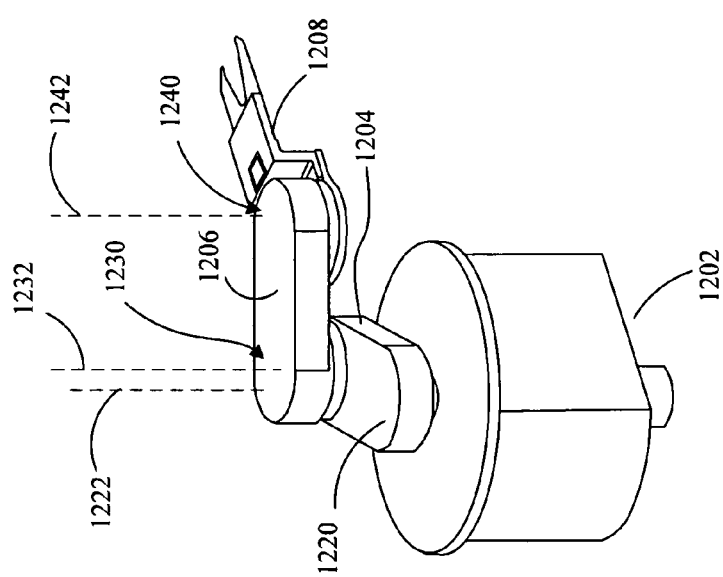

FIGS. 11A, 11B, and 12 schematically depict exemplary portions of a robot for positioning a workpiece within a vacuum, according to an embodiment of the present invention.

Figure 13:
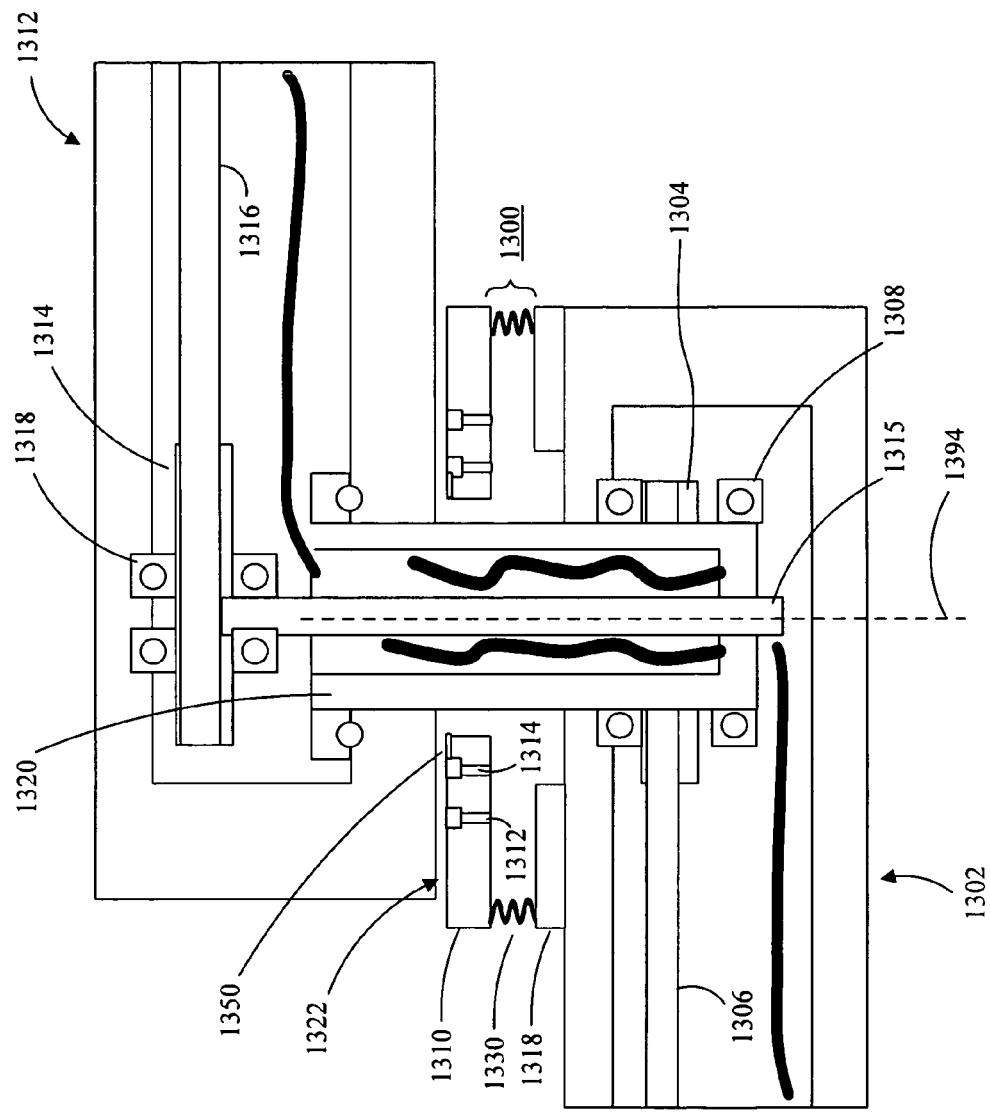

FIG. 13 schematically depicts an exemplary scavenging seal that may be incorporated into a robot for positioning a workpiece in a vacuum, according to an embodiment of the present invention.

One or more embodiments of the present invention will now be described with reference to the accompanying drawings. In the drawings, like reference numbers can indicate identical or functionally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Exemplary Lithographic Apparatus

FIG. 1A schematically depicts a lithographic apparatus 1 according to one embodiment of the invention. The apparatus 1 includes an illumination system (illuminator) IL configured to condition a radiation beam B (e.g., UV radiation or EUV radiation). A support MT (e.g., a mask table) is configured to support a patterning device MA (e.g., a mask) and is connected to a first positioner PM that accurately positions the patterning device in accordance with certain parameters. A substrate table WT (e.g., a wafer table) is configured to hold a substrate W (e.g., a resist-coated wafer) and is connected to a second positioner PW that accurately positions the substrate in accordance with certain parameters. A projection system PS (e.g., a refractive projection lens system) is configured to project a pattern imparted to the radiation beam B by patterning device MA onto a target portion C (e.g., comprising one or more dies) of the substrate W.

The illumination system may comprise various types of optical components, including, but not limited to, refractive, reflective, magnetic, electromagnetic, electrostatic or other types of optical components, or any combination thereof, to direct, shape, or control radiation.

Support MT bears the weight of the patterning device. Further, support MT holds the patterning device in a manner that depends on the orientation of the patterning device, the design of the lithographic apparatus, and other conditions, such as, for example, whether or not the patterning device is held in a vacuum environment. Support MT can use mechanical, vacuum, electrostatic or other clamping techniques to hold the patterning device. Support MT can be a frame or a table, for example, which may be fixed or movable as required. Support MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern comprises phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include, but are not limited to, masks, programmable mirror arrays, and programmable LCD panels. Masks, also called reticles, are well known in lithography, and include binary, alternating phase-shift, and attenuated phase-shift masks, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including, but not limited to, refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As herein depicted, apparatus 1 is of a reflective type (e.g., employing a reflective mask). Alternatively, apparatus 1 may be of a transmissive type (e.g., employing a transmissive mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate is covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1A, the illuminator IL receives radiation from a radiation source SO. The source and the lithographic apparatus may be separate entities, for example, when the source is an excimer laser. In such cases, the source is not considered to form part of the lithographic apparatus and the radiation is passed from the source SO to the illuminator IL with the aid of a beam delivery system that, for example, includes suitable directing mirrors and/or a beam expander. In additional embodiments, the source may be an integral part of the lithographic apparatus, for example when the source is a mercury lamp. The source SO and the illuminator IL, together with the beam delivery system BD, if present, may be referred to as a "radiation system."

In an embodiment, the illuminator IL may comprise an adjuster configured to adjust the angular intensity distribution of the radiation beam. Generally, at least the outer and/or inner radial extent (commonly referred to as $\sigma_{outer}$ and $\sigma_{inner}$, respectively) of the intensity distribution in a pupil plane of the illuminator can be adjusted. In addition, the illuminator IL may include various other components, such as an integrator and a condenser. In such embodiments, the illuminator may be used to condition the radiation beam, to have a desired uniformity and intensity distribution in its cross-section.

The radiation beam B is incident on the patterning device (e.g., mask MA) that is held on the support (e.g., mask table MT) and is patterned by the patterning device. Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 (e.g., an interferometric device, linear encoder or capacitive sensor) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper, as opposed to a scanner, the mask table MT may be connected to a short-stroke actuator only, or may be fixed. Mask MA and substrate W may be aligned using mask alignment marks M1 and M2 and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Substrate table WT, position sensor IF, second positioner PW and other components of the support structure can be inside a vacuum chamber. In such a scenario, an in-vacuum robot IVR can be placed inside the vacuum chamber to transport or move wafers similar to wafer W. If mask table MT and patterning device MA are also in the vacuum chamber, an additional in-vacuum robot IVR can also be used to move patterning devices such as a mask, similar to patterning device MA, in and out of the vacuum chamber. Alternatively, when mask table MT and patterning device MA are outside the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask or wafer) to a fixed kinematic mount of a transfer station.

Controllers for in-vacuum robot IVR, such as those manufactured by Genmark Automation of Milpitas, Calif., are well-known and would be recognizable to one skilled in the art.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a further embodiment, lithographic apparatus 1 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

FIG. 1B schematically depicts an exemplary EUV lithographic apparatus according to an embodiment of the present invention. In FIG. 1, a projection apparatus 1 includes a radiation system 42, an illumination optics unit 44, and a projection system PS. The radiation system 42 includes a radiation source SO, which may be formed by a discharge plasma. In an embodiment, EUV radiation may be produced by a gas or vapor, for example, from Xe gas, Li vapor, or Sn vapor, in which a very hot plasma is created to emit radiation in the EUV range of the electromagnetic spectrum. The very hot plasma can be created by generating an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 positioned in or behind an opening in source chamber 47. In an embodiment, gas barrier 49 may include a channel structure.

Collector chamber 48 includes a radiation collector 50 (also called collector mirror or collector) that may be formed from a grazing incidence collector. Radiation collector 50 has an upstream radiation collector side 50a and a downstream radiation collector side 50b, and radiation passed by collector 50 can be reflected off a grating spectral filter 51 to be focused in a virtual source point 52 at an aperture in the collector chamber 48. Radiation collectors 50 are known from the prior art.

From collector chamber 48, a beam of radiation 56 is reflected in illumination optics unit 44 via normal incidence reflectors 53 and 54 onto a reticle or mask positioned on reticle or mask table MT. A patterned beam 57 is formed, which is imaged in projection system PS via reflective elements 58 and 59 onto wafer stage or substrate table WT. In various embodiments, illumination optics unit 44 and projection system PS may include more (or fewer) elements than depicted in FIG. 1B. For example, grating spectral filter 51 may optionally be present, depending upon the type of lithographic apparatus. Further, in an embodiment, illumination optics unit 44 and projection system PS may include more mirrors than those depicted in FIG. 1B. For example, projection system PS may incorporate one to four reflective elements in addition to reflective elements 58 and 59. In FIG. 1B, reference number 180 indicates a space between two reflectors, e.g., a space between reflectors 142 and 143.

In an embodiment, collector mirror 50 may also include a normal incidence collector in place or in addition to a grazing incidence mirror. Further, collector mirror 50, although described in reference to a nested collector with reflectors 142, 143, and 146, is herein further used as example of a collector. Hence, where applicable, collector mirror 50 as grazing incidence collector may also be interpreted as collector in general and in an embodiment also as normal incidence collector.

Further, instead of a grating 51, as schematically depicted in FIG. 1B, a transmissive optical filter may also be applied. Optical filters transmissive for EUV and less transmissive for or even substantially absorbing UV radiation are known in the art. Hence, "grating spectral purity filter" is herein further indicated as "spectral purity filter" which includes gratings or transmissive filters. Although not depicted in FIG. 1B, EUV transmissive optical filters may be included as additional optical elements, for example, configured upstream of collector mirror 50 or optical EUV transmissive filters in illumination unit 44 and/or projection system PS.

The terms "upstream" and "downstream," with respect to optical elements, indicate positions of one or more optical elements "optically upstream" and "optically downstream," respectively, of one or more additional optical elements. In FIG. 1B, the beam of radiation B passes through lithographic apparatus 1. Following the light path that beam of radiation B traverses through lithographic apparatus 1, a first optical elements closer to source SO than a second optical element is configured upstream of the second optical element; the second optical element is configured downstream of the first optical element. For example, collector mirror 50 is configured upstream of spectral filter 51, whereas optical element 53 is configured downstream of spectral filter 51.

All optical elements depicted in FIG. 1B (and additional optical elements not shown in the schematic drawing of this embodiment) are vulnerable to deposition of contaminants produced by source SO, for example, Sn. Such is the case for the radiation collector 50 and, if present, the spectral purity filter 51. Hence, a cleaning device may be employed to clean one or more of these optical elements as well as a cleaning method may be applied to those optical elements, but also to normal incidence reflectors 53 and 54 and reflective elements 58 and 59 or other optical elements, for example additional mirrors, gratings, etc.

Radiation collector 50 can be a grazing incidence collector, and in such an embodiment, collector 50 is aligned along an optical axis O. The source SO, or an image thereof, is located on optical axis O. The radiation collector 50 may comprise reflectors 142, 143, and 146 (also known as a "shell" or a Wolter-type reflector including several Wolter-type reflectors). Reflectors 142, 143, and 146 may be nested and rotationally symmetric about optical axis O. In FIG. 1B, an inner reflector is indicated by reference number 142, an intermediate reflector is indicated by reference number 143, and an outer reflector is indicated by reference number 146. The radiation collector 50 encloses a certain volume, i.e., a volume within the outer reflector(s) 146. Usually, the volume within outer reflector(s) 146 is circumferentially closed, although small openings may be present.

Reflectors 142, 143, and 146 respectively include surfaces of which at least portion represents a reflective layer or a number of reflective layers. Hence, reflectors 142, 143, and 146 (or additional reflectors in the embodiments of radiation collectors having more than three reflectors or shells) are at least partly designed for reflecting and collecting EUV radiation from source SO, and at least part of reflectors 142, 143, and 146 may not be designed to reflect and collect EUV radiation. For example, at least part of the back side of the reflectors may not be designed to reflect and collect EUV radiation. On the surface of these reflective layers, there may in addition be a cap layer for protection or as optical filter provided on at least part of the surface of the reflective layers.

The radiation collector 50 may be placed in the vicinity of the source SO or an image of the source SO. Each reflector 142, 143, and 146 may comprise at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of (E)UV radiation propagating along the optical axis O. At least two reflectors may be placed substantially coaxially and extend substantially rotationally symmetric about the optical axis O. It should be appreciated that radiation collector 50 may have further features on the external surface of outer reflector 146 or further features around outer reflector 146, for example a protective holder, a heater, etc.

In the embodiments described herein, the term "lens," where the context allows, may refer to any one or combination of various types of optical components, comprising refractive, reflective, magnetic, electromagnetic and electrostatic optical components.

Further, the terms "radiation" and "beam" used herein encompass all types of electromagnetic radiation, comprising ultraviolet (UV) radiation (e.g., having a wavelength $\lambda$ of 365, 248, 193, 157 or 126 nm) and extreme ultra-violet (EUV or soft X-ray) radiation (e.g., having a wavelength in the range of 5-20 nm, e.g., 13.5 nm), as well as particle beams, such as ion beams or electron beams. Generally, radiation having wavelengths between about 780-3000 nm (or larger) is considered IR radiation. UV refers to radiation with wavelengths of approximately 100-400 nm. Within lithography, it is usually also applied to the wavelengths which can be produced by a mercury discharge lamp: G-line 436 nm; H-line 405 nm; and/or I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, DUV radiation used within lithographic apparatus can be generated by an excimer laser. It should be appreciated that radiation having a wavelength in the range of, for example, 5-20 nm relates to radiation with a certain wavelength band, of which at least part is in the range of 5-20 nm.

Exemplary Robots for In-Vacuum Use

FIG. 2 depicts an exemplary robot 200 for positioning a workpiece in a vacuum, according to an embodiment of the present invention. Robot 200 includes a first component 202 that positions a workpiece 204 along a translational axis 292 within a vacuum chamber 290. A shaft 206 supports first component 202, and shaft 206 is rigidly connected to first component 202 such that an axis of symmetry 294 of shaft 206 is perpendicular to translational axis 292. In the embodiment of FIG. 2, both first component 202 and workpiece 204 are located within vacuum chamber 290, although in additional embodiments, only a portion of first component 202 may be positioned within the vacuum chamber.

First component 202 encloses an actuator 220 that engages an elongated member 208 at a first end 208a. A second end 208b of elongated member 208 is rigidly connected to a gripper 210, which supports the workpiece 204. In the embodiment of FIG. 2, actuator 220 drives elongated member 208 along translational axis 292, thereby positioning workpiece 204 within vacuum chamber 290. Workpiece 204 can be a patterning device, including, but not limited to a reticle, or in an alternate embodiment, workpiece 204 can be a substrate or wafer. In additional embodiments, workpiece 204 can be an opto-mechanical device, including, but not limited to, a numerical aperture.

In various embodiments, actuator 220 can be a linear motor, a rotary motor configured to drive a belt, or any additional actuator recognizable by one skilled in the art. Additionally, actuator 220 can include one or more lubricated bearings that support one or more actuator components. Such lubricated bearings may out-gas hydrocarbon molecules into an interior 202a of first component 202. In order to substantially reduce or eliminate out-gassing of hydrocarbon lubricants from actuator 220, first component 202 may be a sealed enclosure, an interior volume 202a of first component 202 may pumped down to near-vacuum conditions. In additional embodiments, actuator 220 includes only greaseless components, including, but not limited to, gas bearings, linear motors, and grease-free sensors (e.g., optical encoders).

In FIG. 2, a first component bearing 212 is positioned to act upon a surface of elongated member 208 as elongated member 208 moves along translational axis 292. In the embodiment of FIG. 2, first component bearing 212 is a gas bearing that introduces a gas, such as nitrogen ($N_2$), along a surface of the elongated member to form a gap (not shown) between a bearing surface and the surface of elongated member 208.

However, gas introduced by first component bearing 212 may leak from the surface of elongated member 208 into vacuum chamber 290, thereby degrading the vacuum environment, increasing the difficulty of maintaining vacuum pressure levels, and potentially damaging optical components housed within vacuum chamber 290. To eliminate (or minimize) leakage of gas from gas bearing 212, a scavenging seal 240, also called a differential seal or differentially-pumped seal, is positioned between gas bearing 212 and vacuum chamber 290 to evacuate gas introduced by bearing 212. In the embodiment of FIG. 2, scavenging seal 240 includes three separate exhaust grooves 240a, 240b, and 240c that evacuate the gas introduced by bearing 212. Further, in additional embodiments, scavenging seal 240 can incorporate any number of exhaust grooves without departing from the spirit or scope of the present invention. For example, exhaust grooves 240a, 240b, and 240c can be pumped down to varying degrees of vacuum, with exhaust groove 240c having the highest level of vacuum due to its proximity to the interior of the vacuum chamber 290. Therefore, the effect of scavenging seal 240 is to eliminate or evacuate gas introduced by first component bearing 212 and to prevent or minimize any leakage of that gas into vacuum chamber 290.

In FIG. 2, shaft 206 passes through vacuum chamber 290 and a second component, shown generally at 230, is positioned outside of vacuum chamber 290 and configured to engage shaft 206. Although not depicted in FIG. 2, second component 230 can also include one or more actuators and linear stages that rotate shaft 206 about axis 294 and drive shaft 206 in a direction parallel to axis 294. In such embodiments, robot 200 combines the rotation of the shaft about axis 294, the motion of the shaft parallel to axis 294, and the motion of workpiece 204 along translational axis 292 to position workpiece 204 within the three-dimensional vacuum chamber.

In the embodiment of FIG. 2, a second component gas bearing 232 supports shaft 206 during rotation about and movement along axis 294. In an embodiment, gas bearing 232 introduces a clean gas, such a nitrogen ($N_2$) along a circumferential surface 206a of shaft 206, thereby generating a gap (not shown) between a surface of gas bearing 232 and shaft 206.

However, the introduction of gas along the circumferential surface 220a may result in leakage of the introduced gas into vacuum chamber 290. In an effort to eliminate or minimize such leakage, a scavenging (or differential) seal 236 is positioned along shaft 220 to evacuate the gas introduced by second component gas bearing 232. In the embodiment of FIG. 2, scavenging seal 236 is located between second component gas bearing 232 and vacuum chamber 290, and an axis of symmetry of scavenging seal 236 is positioned parallel to axis 294. Further, scavenging seal 236 includes three separate exhaust grooves 236a, 236b, and 236c that, collectively, act upon the circumferential surface 220a to evacuate gas introduced by second component gas bearing 232. Therefore, the effect of scavenging seal 236 is to eliminate or evacuate the gas introduced by bearing 232, thereby preventing any leakage of that gas into vacuum chamber 290 while allowing for free rotation of shaft 206 about axis 294 and movement of shaft 206 along axis 294.

In the embodiment of FIG. 2 scavenging seal 236 (and scavenging seal 240) is described in terms of three separate exhaust grooves 236a, 236b, and 236c (and exhaust grooves 240a, 240b and 240c). However, embodiments of the present invention are not limited to such configurations, and an additional embodiment, scavenging seal 236 may incorporate any number of exhaust grooves without departing from the spirit or scope of the present invention. Further, in the embodiment of FIG. 2 scavenging seal 236 is configured to act upon circumferential surface 206a of shaft 206. In an additional embodiment, scavenging seal 236 may be oriented to act upon a surface perpendicular to circumferential surface 206a of shaft 206, or any additional surface of shaft 206, that would be apparent to one skilled in the art without departing from the spirit or scope of the present invention.

In the embodiment of FIG. 2, workpiece 204 is positioned along translational axis 292 through the motion of elongated member 208. However, the present invention is not limited to robots that feature a single elongated member, and FIGS. 3A and 3B are perspective views of an exemplary robot 300 that positions a workpiece using two elongated members, according to an embodiment of the present invention. As described above with reference to FIG. 2, robot 300 includes a first component 302 configured to position a workpiece 304 along a translational axis 392. However, in the embodiment of FIGS. 3A and 3B, robot 300 includes elongated members 308 and 309 that are driven, respectively, along translational axis 392 by an actuator, shown generally at 320. Elongated members 308 and 309 are rigidly connected to gripper 310, which supports a workpiece 304. As described above, exemplary workpieces include, but are not limited to, a patterning device, such as a reticle, a substrate or wafer, and an opto-mechanical device, such as a numerical aperture.

In the embodiment of FIG. 3A, actuator 320 is a linear motor that includes an absolute linear encoder for determining a displacement of the respective actuators and a service loop, including, but not limited to, a moving coil and a moving read head. In additional embodiments, the coil and read head of actuator 320 can be stationary. However, the present invention is not limited to such actuators, and in additional embodiments, actuator 320 may include a toothed belt driven by a rotary motor or any additional actuator that would be recognized suitable by one skilled in the art.

In FIG. 3A, the motion of each elongated member is supported by a gas bearing that introduces a gas, such as nitrogen ($N_2$), along a surface of the elongated member during motion along translational axis 392. In order to prevent the leakage of the introduced gas into the vacuum chamber, a scavenging seal can be positioned between the bearing and the vacuum chamber to evacuate the introduced gas. FIG. 3B is an enlarged perspective view of a region 391 of FIG. 3A, which illustrates the gas bearing and corresponding scavenging seal associated with elongated members 308 and 309, respectively.

In FIG. 3B, a first component gas bearing 312 introduces a gas, such as nitrogen ($N_2$), around a surface of elongated member 308 to form a gap between a surface of bearing 312 and the surface of elongated member 308. Although not depicted in FIG. 3B, a similarly-situated gas bearing introduces a gas about a surface of elongated member 309, thereby forming a gap between a surface of the bearing and the surface of elongated member 309.

In order to eliminate leakage of gas introduced by bearing 312 into the vacuum chamber 390, a scavenging seal 340 is positioned between bearing 312 and a wall of first component 302, e.g., at a location where gripper 310 is connected to elongated members 308 and 309. As described above with reference to FIG. 2, scavenging seal 340 can include three exhaust grooves 340a, 340b, and 340c that, respectively and collectively, evacuate gas introduced by bearing 312. Although not depicted in FIG. 3B, a similar scavenging seal can be positioned about elongated member 309 to evacuate gas introduced by its corresponding gas bearing.

In an additional embodiment, the first component bearing of FIG. 2 can include conventional lubricated bearings having hydrocarbon lubricant. FIG. 4 illustrates such an exemplary robot 400 that incorporates conventional, lubricated bearings, according to an embodiment of the present invention. As described above, a first component 402 is located within a vacuum chamber 490 and is configured to position a workpiece 404 along a translational axis 492. A shaft 406 supports first component 402, and shaft 406 is rigidly connected to first component 402 such that an axis of symmetry 494 of shaft 406 is perpendicular to translational axis 492.

First component 402 encloses an actuator 420 that engages an elongated member 408 at a first end 408a. A second end 408b of elongated member 408 is rigidly connected to a gripper 410, which supports a workpiece 404. In the embodiment of FIG. 4, actuator 420 drives elongated member 408 along translational axis 492, thereby positioning workpiece 404 within vacuum chamber 490. Workpiece 404 can be a patterning device, including, but not limited to a reticle, or in an alternate embodiment, workpiece 404 can be a substrate or wafer. In additional embodiments, workpiece 404 can be an opto-mechanical device, including, but not limited to, a numerical aperture.

Further, a first component bearing 412 is positioned to support one or more surfaces of elongated member 408 during the motion of elongated member along translational axis 492. However, in contrast to the embodiment of FIG. 2, first component bearing 412 is a conventional lubricated bearing utilizing a hydrocarbon lubricant, such as, but not limited to, a lubricated ball bearing assembly. In such an embodiment, hydrocarbon molecules may out-gas from lubricated bearing assembly into an interior 402a of first component 402. In an effort to minimize such out-gassing of hydrocarbon molecules, first component 402 is sealed and interior 402a can pumped down to near-vacuum levels. In FIG. 4, interior 402a is in fluid communication with an interior 406b of shaft 406, and interior 402a can be pumped down through interior 406b, which may be in fluid communication with the non-vacuum environment.

However, despite these precautions, hydrocarbon lubricant associated with first component bearing 412 may out-gas from bearing 412 and foul the sensitive optical components within the vacuum, especially when elongated member 408 moves along translational axis 492. To eliminate or substantially reduce such fouling, a flexible bellows 414 encloses elongated member 408 during its motion within the vacuum in an effort to capture hydrocarbon molecules out-gassed from bearing 412. In the embodiment of FIG. 4, flexible bellows 414 can be sealably mounted to both first component 402 and gripper 410, such that elongated member 408 is enclosed by flexible bellows 414 during motion from a first position to a fully-elongated position. In such an embodiment, flexible bellows 414 captures any hydrocarbon molecules out-gassed from first component bearing 412 during the motion of elongated member 408, thereby substantially reducing, or eliminating, any fouling of sensitive optical components due to out-gassed hydrocarbon molecules.

As described above with reference to FIG. 2, shaft 406 passes through vacuum chamber 490 and a second component, shown generally at 430, is positioned outside of vacuum chamber 490 and configured to engage shaft 406. Although not depicted in FIG. 4, second component 430 can also include one or more actuators and linear stages that rotate shaft 406 about axis 494 and drive shaft 406 along axis 494 in a direction parallel to axis 494. In such embodiments, robot 400 combines the rotation of the shaft about axis 494, the motion of the shaft parallel to axis 494, and the motion of workpiece 404 along translational axis 492 to position workpiece 404 within the three-dimensional vacuum chamber.

In FIG. 4, a second component gas bearing 432 supports shaft 406 during rotation about and movement along axis 492. In an embodiment, gas bearing 432 introduces a clean gas, such nitrogen ($N_2$) along a circumferential surface 406a of shaft 406, thereby generating a gap 434 between a surface of gas bearing 432 and shaft 406.

However, the introduction of gas along the circumferential surface 406a may result in leakage of the introduced gas into vacuum chamber 490. In an effort to eliminate, or reduce substantially, such leakage, a scavenging (or differential) seal 436 is positioned along shaft 406 to evacuate the gas introduced by second component gas bearing 432. In the embodiment of FIG. 4, scavenging seal 436 is located between second component gas bearing 432 and vacuum chamber 490, and an axis of symmetry of scavenging seal 436 is parallel to axis 494. Further, scavenging seal 436 includes two separate exhaust grooves 436a and 436b that, collectively, act upon the circumferential surface 406a to evacuate gas introduced by second component gas bearing 432. In an embodiment, exhaust grooves 436a and 436b may be pumped down, respectively, to any pressure between atmospheric and hard vacuum to evacuate gas introduced by gas bearing 432. In an additional embodiment, exhaust grooves 436a and 436b may be pumped down, respectively, to pressures of about 1 mbar and $1 \times 10^{-3}$ mbar. Therefore, scavenging seal 436 eliminates or evacuates the gas introduced by bearing 432 and prevents or minimizes any leakage of that gas into vacuum chamber 490.

In the embodiment of FIG. 4, scavenging seal 436 includes two separate exhaust grooves 436a and 436b. However, the invention is not limited to such configurations, and in an additional embodiment, scavenging seal 436 can incorporate any number of exhaust grooves that would be apparent to one skilled in the art. Further, in the embodiment of FIG. 4, scavenging seal 436 is configured to act upon circumferential surface 406a of shaft 420. In an additional embodiment, scavenging seal 436 can be oriented to act upon a surface perpendicular to circumferential surface 406a of shaft 406, or any additional surface of shaft 406, that would be apparent to one skilled in the art without departing from the spirit or scope of the present invention.

FIGS. 5A and 5B depict additional features of the exemplary robot of FIG. 4. In FIGS. 5A and 5B, a first component 502 encloses an actuator 520 that engages an elongated member 508 at a first end 508a. A second end 508b of elongated member 508 is rigidly connected to a gripper 510, which supports a workpiece 504. First component 502 is supported by a shaft 506 such that an axis of symmetry 594 of shaft 506 is perpendicular to translational axis 592. In various embodiments, workpiece 504 includes, but is not limited to a patterning device, such as a reticle, a wafer or substrate, or an opto-mechanical device, such as numerical aperture.

In FIGS. 5A and 5B, actuator 520 includes a slider 520a rigidly connected to end 508a of elongated member 508, although in additional embodiments, slider 520a is connected to elongated member 508 at any position along elongated member 508 that is spatially removed gripper 510. Slider 520a is driven along a linear guide 520b by the movement of a toothed belt 520c, which in turn is driven by a rotary motor (not shown). Further, bearing 520d is positioned between slider 520a and linear guide 520b, and in various embodiments, bearing 520d may be a lubricated bearing, a gas bearing, or any additional bearing that would be apparent to one skilled in the art. The motion of slider 520a, which is connected to elongated member 508, along linear guide 520b, results in the motion of elongated member 508 along translational axis 592.

In FIGS. 5A and 5B, a first component bearing (not shown) supports one or more surfaces of elongated member 508 during the motion of elongated member 508 along translational axis 592. In the embodiment of FIG. 5A, the first component bearing is a lubricated bearing utilizing a hydrocarbon lubricant, including, but not limited to a ball bearing assembly or any of a number of additional lubricated bearings that would be apparent to one skilled in the art. As described above with respect to FIG. 4, a flexible bellows 514 encloses elongated member 508 and the first component bearing, thereby eliminating out-gassing of the hydrocarbon lubricant into the vacuum chamber.

In FIG. 5A, elongated member 508 is disposed in an unactuated position in which slider 520a rests in an initial position along linear guide 520b. In contrast, FIG. 5B depicts the exemplary robot 500 of FIG. 5A in a fully-actuated position. Once actuated, toothed belt 520c advances in a clockwise manner to drive slider 520a along linear guide 520b, thereby advancing elongated member 508 and workpiece 504 along translational axis 592 within vacuum chamber 590. Further, as elongated member 508 advances along translational axis 592, bellows 514 expands to maintain its enclosure of elongated member 508 and first component bearing 512, thereby substantially reducing, or eliminating, out-gassing of hydrocarbon molecules during the full range of motion of elongated member 508.

In an embodiment, a maximum displacement of workpiece 504 along translational axis 592 may range from about 500 mm to 830 mm. For example, the maximum displacement of an opto-mechanical device, such as a numerical aperture, may be about 500 mm, while robot 500 may displace a substrate up to about 600 mm along translational axis 592 and reticle up to about 830 mm along the translational axis. In additional embodiments, maximum workpiece displacements may exceed these exemplary values, or alternatively, fall below these exemplary values, without departing from the spirit or scope of the present invention.

In the embodiment of FIGS. 5A and 5B, actuator 520 includes toothed belt 520c that engages and drives slider 520a along guide 520b. However, the present invention is not limited to such actuators. In additional embodiments, elongated member 508 can be driven using a variety of additional actuators, such as the linear motor described above with reference to FIG. 2, without departing from the spirit or scope of the present invention.

In the embodiments described above, a single bellows encloses a single elongated member during motion along a translational axis. However, the present invention is not limited to such embodiments, and FIG. 6 is a perspective view of an exemplary robot 600 that positions a workpiece using multiple elongated members enclosed by multiple flexible bellows, according to an embodiment of the present invention. In FIG. 6, elongated members 608 and 609 are rigidly connected to gripper 610, respectively, through gripper supports 611a and 611b.

In FIG. 6, actuators 620 and 621 utilize linear motors to drive elongated members 608 and 609, respectively, along translational axis 692. For example, a linear motor of actuator 620 drives a slider 620a, which is connected to elongated member 608, along a linear guide 620b. The motion of slider 620a along linear guide 620b drives elongated member 608 along translational axis 692. The motion of elongated member 608, coupled with a similar motion of elongated member 609 generated by actuator 621, positions workpiece 604 along translational axis 692 within the vacuum (not shown). This motion, coupled with the rotation of first enclosure 602 about an axis of symmetry 694 of a shaft 606 that supports first component 602, and motion of first component 602 along axis 694, allows robot 600 to position workpiece 604 along three dimensions in the vacuum environment.

As described above, first component bearings 612 and 613 respectively act upon a surface of elongated members 608 and 609, and in the embodiment of FIG. 6, the first component bearings are lubricated bearings that utilize a hydrocarbon lubricant. As such, flexible bellows 614 and 615 respectively enclose elongated members 608 and 609 over the full range of their motion to substantially reduce out-gassing of hydrocarbon molecules into the vacuum environment.

In the embodiments described above, a first component of a robot is sealed, and an interior of the first component is pumped down to near vacuum levels to substantially reduce any communication of contaminants from the interior of the first component into the vacuum. However, in additional embodiments, a first component of a robot may be unsealed and exposed to the vacuum environment, as illustrated by FIGS. 7A and 7B.

FIGS. 7A and 7B depict an exemplary robot 700 for positioning a workpiece 704 in a vacuum, according to an embodiment of the present invention. In FIG. 7A, robot 700 includes a first component 702 positioned within a vacuum chamber 790 and configured to position workpiece 704 along a translational axis 792 within the vacuum. A shaft 706 is rigidly connected to first component 702 such that an axis of symmetry 794 of shaft 706 is perpendicular to translational axis 792. Further, although not depicted in FIGS. 7A and 7B, robot 700 also includes a second component, positioned outside of the vacuum chamber to engage shaft 720. In an embodiment, the second component can include a number of additional actuators and linear stages to rotate shaft 706 about axis 794 and to move shaft 706 along axis 794 in a direction parallel to axis 794. Thus, robot 700 can combine the rotation of the shaft about axis 794, the motion of the shaft parallel to axis 794, and the motion of workpiece 704 along translational axis 792 to position workpiece 704 within the three-dimensional vacuum chamber.

First component 702 houses an actuator 720 that engages an elongated member 708 at a first end 708a. A second end 708b of elongated member 708 is rigidly connected to a gripper 710, which supports a workpiece 704. In the embodiment of FIGS. 7A and 7B, actuator 720 drives elongated member 708 along translational axis 792 in a direction 798, thereby positioning workpiece 704 within vacuum chamber 790. Workpiece 704 can, in various embodiments, be a patterning device such as a reticle, a substrate or wafer, or an opto-mechanical device, such as a numerical aperture.

In the embodiment of FIGS. 7A and 7B, actuator 720 is linear motor having a slider 720a that is driven along a gas bearing way 720b and that is connected to an external controller (not shown) through service loop 720c. Elongated member 708 is attached to slider 720a at end 708a, and as such, motion of slider 720a along gas bearing way 720b drives elongated member 708 to position workpiece 704 along translational axis 792. In additional embodiments, slider 720a is attached to elongated member 708 at any position along elongated member 708 that is spatially removed from second end 708b without departing from the spirit or scope of the present invention.

Actuator 720 also includes gas bearing 720d that acts upon a surface of gas bearing way 720b. In an embodiment, gas bearing 704d introduces a clean gas, such as nitrogen (N$_2$), along a surface of gas bearing way 720b to form a gap (not shown) between gas bearing way 720b and gas bearing 720d. However, gas bearing 720d is not limited to the use of such gases, and in additional embodiments, gas bearing 720d can introduce any suitable gas that would be apparent to one skilled in the arts. Further, actuator 720 include a linear encoder 720f and a read head 720e that, collectively, trace the motion of slider 720a along gas bearing way 720b.

Unlike the embodiments described above, first enclosure 702 is not sealed, and therefore, actuator 720 is exposed to the environment of the vacuum chamber. In order to substantially reduce, or eliminate, leakage of gas from gas bearing 720d into the vacuum chamber, gas bearing 720d is positioned between scavenging seals 740 and 741, which respectively evacuate the gas introduced by gas bearing 720d along the surface of guide 720b. Although not depicted in FIG. 7A, scavenging seals 740 and 741 can, respectively, feature two or more exhaust grooves that are pumped down to various levels of vacuum in order to evacuate the gas introduced by gas bearing 720d, as described above with reference to FIG. 2.

FIG. 7B schematically depicts robot 700 in a fully-actuated configuration. In FIG. 7B, linear motor 720 is activated to drive slider 720a from a first position, as depicted in FIG. 7A, to a fully-actuated position, shown generally at 797 in FIG. 7B. The motion of slider 720a along gas bearing way 720b likewise drives elongated member 708, thereby positioning workpiece 704 along translational axis 792 within vacuum chamber 790. In the embodiment of FIGS. 7A and 7B, the displacement of workpiece 704 in the translational direction, shown generally at 793, can be larger than comparable translational displacements achieved by similar robots having actuators housed in sealed enclosures, such as those depicted in FIGS. 2 and 5. Such a translational displacement of workpiece 704, without corresponding increase in the dimensions of elongated member 708, can be achieved because the bearing structures that support the movement of the elongated arm are housed completely within the first component 702 and are not limited by scavenging seals and/or bellows mounted adjacent to first enclosure 702.

FIG. 8 is a perspective view of the exemplary robot of FIGS. 7A and 7B in a fully-actuated position. In FIG. 8, a first component 802 is located within a vacuum chamber (not shown) and configured to position a workpiece (not shown) along a translational axis 892. Elongated member 808 is rigidly connected to a gripper 810, which is configured to support the workpiece. Further, in the embodiment of FIG. 8, a shaft 806 is rigidly connected to first component 802 such that an axis of symmetry 894 of shaft 806 is perpendicular to translational axis 892.

As described above, an actuator 820 is exposed to the vacuum. As described above, actuator 820 is a linear motor configured to advance a slider (not shown) along multiple gas bearing ways, and one or more gas bearings are positioned proximate to the slider to act upon a surface (or surfaces) of the gas bearing ways. For example, the slider is driven along a gas bearing way 820b, and a gas bearing 820d can introduce a clean gas, such as nitrogen (N$_2$), along a surface of guide 820b. As described above, scavenging seals 840 and 841 are positioned, respectively, adjacent to gas bearing 820d to evacuate gas introduced by gas bearing 820d. In an embodiment, scavenging seals 840 and 841 include, respectively, two exhaust grooves, such as exhaust grooves 840a and 820d of scavenging seal 840, that exhaust the gas introduced by gas bearing 820d, thereby substantially reducing any leakage of the introduced gas into the vacuum.

As depicted in FIG. 8, actuator 820 drives elongated member 808 along translational axis 892 to position the workpiece within the vacuum. Although not shown in FIG. 8, a second component can include a number of additional actuators and linear stages to rotate shaft 806 about axis 894 and to move shaft 806 along axis 894 in a direction parallel to axis 894.

Figure 9A:
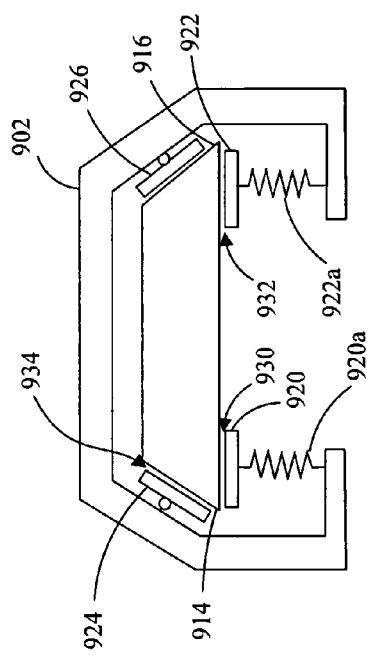
Figure 9B:
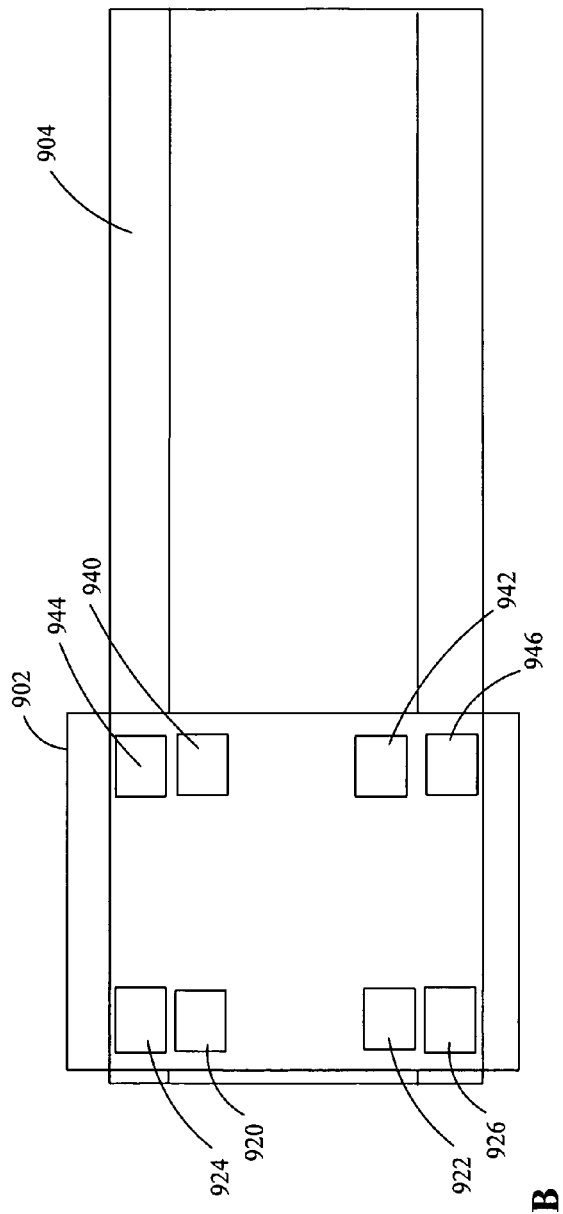

FIGS. 9A and 9B are cross-sectional and overhead views, respectively, of a slider and guide assembly 900 that can be incorporated into the exemplary robot of FIG. 8. In the embodiment of FIGS. 9A and 9B, a slider 902 is positioned about a gas bearing way 904 and configured to be driven along gas bearing way 904 by an actuator assembly, such as actuator 820 in FIG. 8.

In FIG. 9A, a cross-sectional image of guide 904 forms an isosceles trapezoid, e.g., a quadrilateral with a line of symmetry bisecting one pair of opposite sides, although in additional embodiments, gas bearing way 904 can have any of a number of cross-sectional shapes apparent to one skilled in the art. Further, as depicted in FIG. 9A, slider 902 surrounds gas bearing way 904, and gas bearings 920, 922, 924, and 926 are positioned on slider 902 to introduce gas, respectively, onto surfaces of gas bearing way 904. In one embodiment, gas bearing 920, 922, 924, and 926 introduce a clean gas, such as nitrogen ($N_2$), onto surfaces of gas bearing way 904. However, the present invention is not limited to such gases, and gas bearing 920, 922, 924, and 926 can utilize any of a number of gases that would be apparent to one skilled in the arts.

For example, in FIG. 9A, gas bearing 924 is positioned such that a surface of gas bearing 924 is parallel to a surface 914 of gas bearing way 904 and configured to introduce gas along a surface 914 to set a gap 934 between surface 914 and gas bearing 924. Similarly, a surface of gas bearing 926 is parallel to a surface 916 of gas bearing way 904, and gas bearing 926 introduces gas along surface 916 to set a gap 936 between surface 916 and gas bearing 936.

Gas bearings 920 and 922 are loaded, respectively, onto springs 920a and 922a and positioned such that a surface of gas bearings 920 and 922 introduces gas, respectively, along surface 910 of gas bearing way 904. The gas introduced by gas bearings 920 and 922 respectively sets gaps 930 and 932 between the surfaces of gas bearings 930 and 932 and surface 910 of gas bearing way 904.

As described above, gas bearings 920, 922, 924, and 926 are housed within an open enclosure and therefore, are exposed to the environment of the vacuum chamber. As such, the leakage of gas from gas bearings 920, 922, 924, and 926 must be substantially reduced to minimize the fouling of sensitive optical components in the vacuum chamber. Although not depicted in FIG. 9A, scavenging seals, such as those described above in FIGS. 7A and 7B, are positioned about a portion of a perimeter of a surface of respective gas bearings 920, 922, 924, and 926 to evacuate gas introduced by these bearings and substantially reduce, or eliminate, leakage of the gas into the vacuum chamber.

FIG. 9B depicts an overhead view of the exemplary slider and guide assembly 900 depicted in FIG. 9A. As described above, slider 902 is positioned about gas bearing way 904 and configured to be driven along gas bearing way 904. In one embodiment, gas bearings 920, 922, 924, and 926 are positioned proximate to a first edge of slider 902, and an additional set of gas bearings 940, 942, 944, and 946 are positioned proximate to an edge of slider 902 opposite the first edge. As described above, the cross-section of gas bearing way 904 form a polygon, and gas bearings 920, 922, 924, and 926 and additional gas bearings 940, 942, 944, and 946 can be arrayed about the surface of gas bearing way 904 as described above with respect to FIG. 9A to provide opposing forces. Although not depicted in FIG. 9B, scavenging seals, such as those described above in FIGS. 7A and 7B, can be positioned about a portion of a perimeter of a surface of respective gas bearings 920, 922, 924, and 926 and respective additional gas bearings 940, 942, 944, and 946 to evacuate gas introduced by these bearings and substantially reduce, or eliminate, leakage of the gas into the vacuum chamber.

Figure 9C:
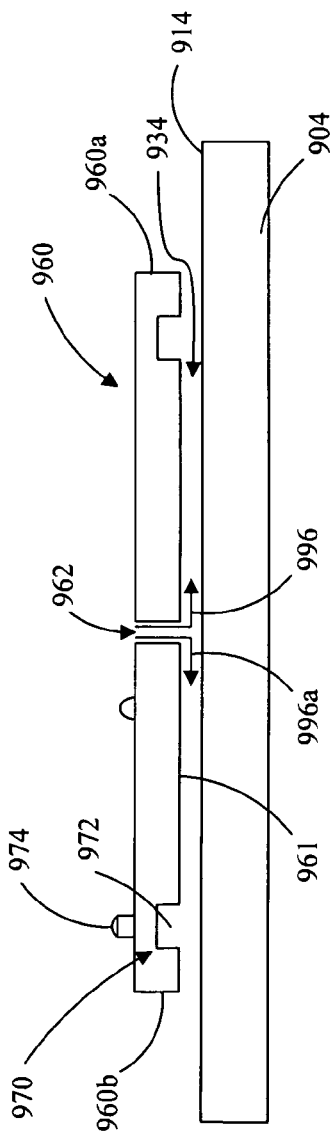
Figure 9D:
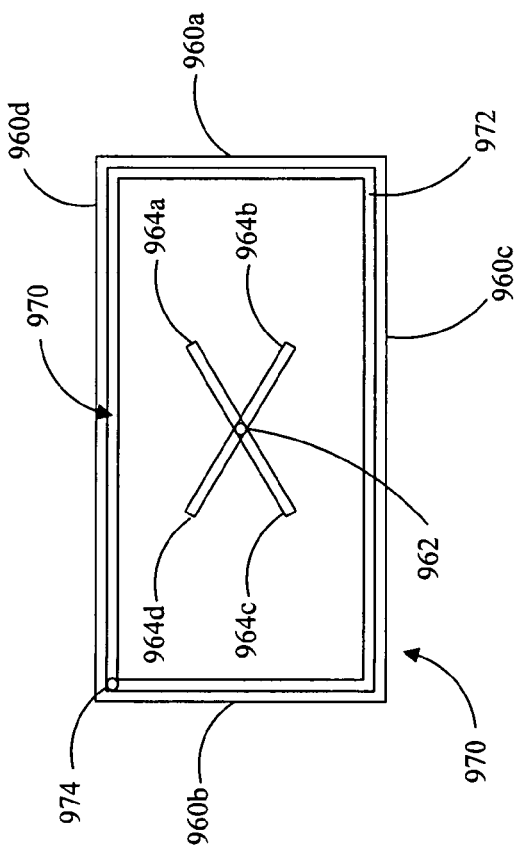

FIGS. 9C and 9D depict cross sectional and overhead views of a linear gas bearing that can be incorporated into the exemplary slider and guide assembly of FIGS. 9A and 9B. In FIG. 9C, a gas bearing 960 is positioned such that a surface 961 of gas bearing 960 is parallel to a surface 914 of a gas bearing way, such as gas bearing way 904 of FIG. 9A. A clean gas, such as nitrogen ($N_2$), is introduced through a central port 962 of gas bearing 960, and the introduced gas travels along paths 996a and 996b between surface 961 and surface 914, thereby setting a gap 934 between surfaces 961 and 914. In an embodiment, shown in FIG. 9D, gas flows through central port 962 and is distributed along surface 961 through one or more distribution grooves formed in surface 961.

As described above, gas bearing 960 is exposed to the vacuum environment, and as such, a scavenging seal, shown generally at 970, is configured to evacuate gas introduced by bearing 960, thereby substantially reducing, or eliminating, leakage of the gas into the vacuum chamber. In FIG. 9C, scavenging seal 970 includes an annular exhaust groove 972 formed in surface 961 and positioned along the perimeter of surface 961. Scavenging seal 970 also includes a vacuum port 974 in fluid communication with exhaust groove 972 and configured to pump down exhaust groove 472 to a high level of vacuum (e.g., a value between 1 mbar and $1 \times 10^{-3}$ mbar).

In the embodiment of FIG. 9C, gas introduced through central port 962 travels from central port 962 toward edges 960a and 960b of gas bearing 960 along paths 996a and 996b. Exhaust groove 972 is pumped down to a high level of vacuum through vacuum port 974, and gas introduced through central port 962 is subsequently exhausted through groove 972 and out of bearing 960 through exhaust port 974 to eliminate, or substantially reduce, the leakage of gas into the vacuum environment.

FIG. 9D depicts an overhead view of surface 961 of gas bearing 960 depicted in FIG. 9C. In FIG. 9D, surface 461 of gas bearing 964 has a rectangular footprint having a perimeter that is defined by edges 960a, 960b, 960c, and 960d. Central port 962 penetrates bearing 960 and is in fluid communication with distribution grooves 964a, 964b, 964c, and 964d. These grooves distribute gas introduced through central port 962 along surface 961 to set a gap between surface 961 and a surface of a gas bearing way, as depicted in FIG. 9C.

In the embodiment of FIG. 9D, distribution grooves 964a, 964b, 964c, and 964d respectively originate at central port 962 and radiate from central port 962 towards the edges of gas bearing 964. However, in additional embodiments, surface 961 of bearing 960 may incorporate any number or arrangement of distribution grooves in fluid communication with central port 962 without departing from the spirit and scope of the present invention.

As described above, exhaust groove 972 is positioned along a perimeter of surface 961 defined by edges 960a, 960b, 960c, and 960d, and exhaust groove 972 forms a circuit in fluid communication with vacuum port 974. Upon pumping exhaust groove 972 down to a high level of vacuum, gas introduced through central port 962 of bearing 960 is exhausted through groove 972 and vacuum port 974.

In the embodiments of FIGS. 9C and 9D, gas bearing 960 is a linear bearing have a rectangular footprint defined by edges 960a, 960b, 960c, and 960d. However, gas bearing 960 is not limited to such a bearing, and in additional embodiments, gas bearing 960 may be a linear bearing having a circular footprint, an elliptical footprint, a polygonal footprint, or any additional footprint apparent to one skilled in the art without departing from the spirit or scope of the invention.

Further, in FIGS. 9C and 9D, exhaust groove 972 is disposed proximate to edges 960a, 960b, 960c, and 960d. However, in additional embodiments, exhaust groove 972 may be positioned in any configuration that forms a complete circuit surrounding central port 962 and distribution grooves 964a, 964b, 964c, and 964d without departing from the spirit or scope of the present invention. Further, in additional embodiments, exhaust groove 972 may form any circular, elliptical, or polygonal circuit that surrounds both central port 962 and distributing grooves 964a, 964b, 964c, and 964d without departing from the spirit or scope of the present invention.

FIG. 10 is a perspective view of a rectangular gas bearing assembly 1000 incorporated into an exemplary robot for positioning a workpiece in a vacuum, according to an embodiment of the present invention. In the embodiment of FIG. 10, assembly 1000 is disposed in a sealed enclosure (not shown), such as first component 202 of FIG. 2 and first component 402 of FIG. 4, which is positioned wholly or partly within a vacuum chamber.

In FIG. 10, a gas bearing stage 1002 supports a carriage 1004, to which elongated members 1008 and 1009 are attached at their respective first ends. For example, a first end 1008a of elongated member 1008 is rigidly connected to carriage 1004. In the embodiment of FIG. 10, a linear motor drives carriage 1004 along bearing way 1002, thereby driving elongated members 1008 and 1009 along a translational axis 1092. To provide such motion, a motor winding 1020a is fixed to carriage 1004, and upon actuation by an external controller (not shown), motor winding 1020a is driven along magnetic guide 1020b, thereby driving carriage 1004 and the elongated members along translational axis 1092. In an embodiment, magnetic guide 1020b may be a permanent magnetic U-channel of an air-core brushless DC linear motor. As respective second ends of elongated members are rigidly attached to a gripper, which in turn supports a workpiece, the motion of the elongated members, e.g. elongated member 1008, along translational axis 1092 positions the workpiece in the vacuum, as described above with reference to FIGS. 2 and 4. Further, a position of carriage 1004 along bearing stage 1002 is monitored by a linear encoder 1020e and a read head 1020f fixed to carriage 1004. In various embodiments, linear encoder 1020e can be an absolute encoder or an incremental encoder, and read head 1020f can be a magnetic read head or an optical read head, without departing from the spirit or scope of the present invention.

Gas bearing stage 1002 introduces a clean gas, such as nitrogen ($N_2$) onto a surface of carriage 1004, thereby setting a gap (not shown) between bearing stage 1002 and carriage 1004. In the embodiment of FIG. 10, gas introduced along bearing stage 1002 are discharged into the environment of the sealed enclosure. In order to eliminate leakage of introduced gas from those points where elongated members 1008 and 1009 pass through the enclosure, scavenging seals 1040 and 1041 are positioned, respectively, about elongated members 1008 and 1009 and are fixed to the wall of the enclosure at those point where elongated members 1008 and 1009 respectively pass through the enclosure.

For example, scavenging seal 1040 is oriented to act on a surface of elongated member 1008, as described above with reference to FIG. 2, and scavenging seal 1040 is fixed to a wall of the enclosure (not shown) at a point where elongated member 1008 passes through the enclosure. In the embodiment of FIG. 10, scavenging seals 1040 and 1041 do not bear the load of the gripper and workpiece, but instead float over the surfaces of the respective elongated members. Further, as described above with reference to FIG. 2, scavenging seals 1040 and 1041 can incorporate any of a number of exhaust grooves to exhaust the gas introduced by bearing stage 1002 into the enclosure.

FIGS. 11A and 11B depict a lower portion 1100 of an exemplary robot for positioning a workpiece within a vacuum, in accordance with an embodiment of the invention. Lower portion 1100 engages a shaft 1106, which supports a first component of a robot, such as first component 202 in FIG. 2. In the embodiment of FIGS. 11A and 11B, lower portion 1100 includes a first gas bearing 1132 and a second gas bearing 1133 that collectively introduce gas along a circumferential surface 1106a of shaft 1106 to establish a gap 1134 between circumferential surface 1106a and a surface of first and second gas bearings 1132 and 1133, respectively. In an embodiment, first and second gas bearings 1132 and 1133 can introduce a clean gas, such as nitrogen ($N_2$), along circumferential surface 1106a. However, in additional embodiments, first and second gas bearings 1132 and 1133 can utilize any of a number of additional or alternative clean or noble gases that would be apparent to one skilled in the art.

As described above, a scavenging seal 1136 is positioned between gas bearings 1132 and 1133 and a wall of a vacuum chamber (not shown), and an axis of symmetry of scavenging seal 1136 is oriented parallel to an axis of symmetry 1194 of shaft 1106. In the embodiment of FIGS. 11A and 11B, scavenging seal 1136 includes a first exhaust groove 1136a and a second exhaust groove 1136b that collectively and respectively evacuate the gas introduced by first and second gas bearings 1132 and 1133. For example, first exhaust groove 1136a is pumped down to a pressure of about 1 mbar to evacuate gas, and second exhaust groove 1136b is pumped down to a pressure of about $1 \times 10^{-3}$ mbar to evacuate additional gas, thereby eliminating, or substantially reducing, any leakage of the introduced gas into the vacuum chamber.

Further, shaft 1106 may include a hollow portion, such as portion 406a of FIG. 4, in fluid communication with an interior of a first component of the robot, such as interior 402a of first component 402 of FIG. 4. In such an embodiment, port 1135 is used to pump down the interior of the sealed enclosure to near-vacuum conditions, thereby substantially reducing any out-gassing from components disposed within the enclosure, as described above with reference to FIG. 4.

In FIGS. 11A and 11B, a motor 1140 engages shaft 1106 and, upon activation by an external controller (not shown), rotates shaft 1106 about axis 1194, thereby rotating the first component of the robot. In the embodiment of FIGS. 11A and 11B, first and second gas bearings 1132 and 1133 provide rotational support for shaft 1106 as shaft 1106 rotates about axis 1194. Further, in FIG. 11A, a thrust bearing 1160 axially supports shaft 1106 during motion about axis 1194. In one embodiment, shown in FIG. 11A, thrust bearing 1160 is a gas bearing that introduces gas along a surface of a bearing plate 1162 disposed perpendicular to circumferential surface 1106a of shaft 1106. Further, the rotational motion of shaft 1106 is tracked by an absolute encoder 1142, which is connected to the external controller.

In the embodiment of FIG. 11A, lower portion 1100 positions shaft 1106, and the first portion of the robot connected to shaft 1106, in a direction parallel to axis 1194 using a linear-driven stage 1150. Linear-driven stage 1150 includes a fixed portion 1152 that is rigidly connected to lower portion 1100, which houses scavenging seal 1136 and first and second gas bearings, an absolute encoder (not shown), and a movable portion 1154 rigidly connected to motor 1140 and bearing 1160 through rigid connection 1156.

In an additional embodiment, thrust bearing 1160 can include a conventional, lubricated rotary bearing, including, but not limited to a lubricated ball bearing or a lubricated needle bearing. In such an embodiment, shown in FIG. 11B, a lubricated rotary bearing 1161 axially supports shaft 1106 during motion about axis 1194, and movable portion 1154 is flexibly connected to motor 1140 and rotary bearing 1161 through a flexural connection 1157. In one embodiment, flexural connection 1157 meets specified requirements for movement along axis 1194 and a translational axis, such as translational axis 292 of FIG. 2, as well as tensile and/or compressive forces along these axes. As described above in FIG. 11A, lower portion 1100 positions shaft 1106, and the first portion of the robot connected to shaft 1106, in a direction parallel to axis 1194 using a linear-driven stage 1150.

In response to an external controller, linear stage 1150 depicted in FIGS. 11A and 11B activates and displaces movable portion 1154 in a direction parallel to axis 1194, thereby displacing shaft 1106 and the first component within the vacuum. In an embodiment, a maximum displacement may range between about 20 mm and about 75 mm. In additional embodiments, the maximum displacement may exceed, or alternatively, may fall below these exemplary values, without departing from the spirit or scope of the present invention. Thus, linear stage 1150, in conjunction with motor 1140, allows the robot to position the workpiece in three dimensions within the vacuum, e.g., rotational motion about axis 1194, axial motion parallel to axis 1194, and translational motion along a translational axis, such as axis 292 of FIG. 2.

In the embodiments described above, gas introduced by gas bearings along a surface of a shaft or elongated member is evacuated through scavenging seals oriented to act upon a circumferential surface of a shaft or elongated member. For example, scavenging seal 1136 of FIGS. 11A and 11B acts upon a circumferential surface of shaft 1106 along which first and second gas bearings 1132 and 1133 introduce gas. However, the present invention is not limited to such scavenging seals, and in additional embodiments, similar to those depicted in FIG. 13, a scavenging seal can be positioned to act upon a surface perpendicular to a circumferential surface of a shaft, and therefore, perpendicular to an axis of symmetry of the shaft.

Further, in the embodiments described above, a workpiece is positioned in a vacuum along a translational axis by motion of an elongated member that supports the workpiece. However, the present invention is not limited to such motion, and in additional embodiments, the workpiece can be positioned within the vacuum along not only the translational axis, at points within a plane that includes the translational axis, as described in FIG. 12.

FIG. 12 depicts an exemplary first component 1200 of a robot for positioning a workpiece within a vacuum, according to an embodiment of the invention. FIG. 12 includes an actuator 1202 connected to a first arm 1204 through a joint 1220. In FIG. 12, actuator 1202 is configured to rotate first arm 1204 about axis 1222 of joint 1220. A second joint 1230 connects first arm 1204 to a second arm 1206, thereby allowing a rotation of second arm 1204 relative to first arm 1202 about an axis 1232 of joint 1230. Further, a third joint 1240 connects second arm 1204 with a gripper 1208, thus allowing a relative rotational movement of second arm 1204 and gripper 1208 about an axis 1242 of joint 1240. Although not shown in FIG. 12, gripper 1208 can support a workpiece, including, but not limited to, a reticle, a substrate or wafer, and an opto-mechanical device, such as a numerical aperture. Further, although not depicted in FIG. 12, first component 1200 can be positioned wholly, or partially, within a vacuum chamber, such as vacuum chamber 290 of FIG. 2.

In an embodiment, first arm 1204 and second arm 1206 may be provided with respective internal actuation assemblies that drive the rotation of the first arm relative to the second arm and alternatively or additionally, the second arm relative to the gripper in response to the actuator 1202. For example, a belt assembly within first arm 1204 may be driven by a shaft of actuator 1202 and rotate second arm 1206 about axis 1222 relative to the rotation of first arm 1204. Further, for example, a belt assembly within second arm 1206 may rotate gripper 1208 about axis 1242 relative to the rotation of second arm 1204 and first arm 1202. As such, the rotational motion of first arm 1204 about axis 1222, the relative rotational motion of second arm 1204 about axis 1232, and the relative rotational motion of gripper 1208 collectively combine to position the workpiece within the vacuum chamber along a plane mutually perpendicular to axes 1222, 1232, and 1242.

In an additional embodiment, not depicted in FIG. 12, first component 1200 can be supported by a shaft having an axis of symmetry parallel to axis 1222, 1232, and 1242. Such a shaft can be engaged by a second component, such as second component 1230 of FIG. 2, which can rotate the shaft and first component 1200 about the axis of symmetry, and which can drive the shaft and first component 1200 in a direction parallel to the axis of symmetry.

FIG. 13 illustrates an exemplary scavenging seal 1300 incorporated into the joints of the robot of FIG. 12. In an embodiment, joints 1220, 1230, and 1240 are, respectively, exposed to the environment of the vacuum chamber. As such, conventional lubricated bearings, such as those described above with reference to FIG. 4, are unacceptable for use in these joints because the lubricated bearing out-gas hydrocarbon molecules into the vacuum environment, thereby fouling sensitive optical equipment. Further, conventional gas bearings would, under such circumstances, leak, and introduce gas into the vacuum environment, also damaging sensitive optical equipment.

In FIG. 13, a first component 1302, such as first arm 1204 of FIG. 12, is configured on a plane parallel to a second component 1312, such as second arm 1206 of FIG. 12. First component 1302 is joined to second component 1312 through shaft 1320, thereby forming a joint 1330 between the components that allows rotation of the components relative to each other about shaft 1320. In the embodiment of FIG. 13, first component 1302 houses a first pulley 1304, which is mounted about shaft 1320 and driven by a first belt 1306. The rotational motion of pulley 1306 is applied to shaft 1320 and therefore, the rotational motion of the pulley is transferred through shaft 1320 to a second pulley 1314, housed within second component 1312. In the embodiment of FIG. 13, second pulley 1314 is fixed to shaft 1320 through a mounting shaft 1315. Further, a second belt 1316 can transfer the rotational motion of second pulley 1314 to an additional component (not shown). As such, the motion of the pulleys within first component 1302 and second component 1312 results in the relative rotational movement between the first and second components about shaft 1320.

In FIG. 13, a set of rotational bearings 1308 support the rotational motion of first pulley 1304, and a similar set of rotational bearings 1318 supports the rotational motion of second pulley 1314. In various embodiments, rotational bearings 1308 and 1318 can be conventional lubricated bearings that out-gas hydrocarbon molecules into the interior of the component, or alternatively, gas bearings that may leak a clean gas, such as nitrogen ($N_2$), into the interior of the component. As such, even if the interiors of the respective components are pumped down to near-vacuum conditions, hydrocarbon molecules or lubricating gas could leak from these components into the vacuum atmosphere, thereby damaging sensitive optical equipment.

Therefore, scavenging seal 1300 is positioned between first component 1302 and second component 1312 to facilitate rotation of first component 1302 and second component 1304, respectively, about shaft 1320 while evacuating outgassed hydrocarbon molecules or lubricating gases leaked from the interiors of first component 1302 and second component 1304. In the embodiment of FIG. 13, an axis of symmetry 1394 of scavenging seal 1300 is positioned parallel to an axis of symmetry of shaft 1320, as depicted in FIG. 13. As such, a surface scavenging seal 1300 acts not on a circumferential surface of a shaft, as described above in FIG. 2, for example, but on surfaces of first and second components 1302 and 1312 that are mutually perpendicular to axis 1394.

Scavenging seal 1300 includes a first seal plate 1310 disposed proximate to a surface 1322 of second component 1312, a second seal plate 1318 disposed on a surface 1324 of first component 1302, and a flexible bellows 1330 rigidly attached to both first seal plate 1310 and second seal plate 1318. First seal plate 1310 further includes a flow channel 1314 and a pump channel 1312.

In the embodiment of FIG. 13, a gas, such as nitrogen ($N_2$), is introduced into flow channel 1314 at near-atmospheric pressure to set a gap 1350 between a surface of the first seal plate 1310 and surface 1322. Subsequently, introduced gas is evacuated through pump channel 1312 and into the non-vacuum environment. The generation of a viscous layer between surface 1322 and the first sealing plate 1310 minimizes leakage of the introduced gas into the vacuum environment. In one embodiment, gas enters flow channel 1314 at a pressure of 500 mbar and is evacuated through pump channel 1312 at a pressure of 26 mbar into the non-vacuum environment, resulting in a gap thickness of approximately 20 microns for gap 1350.

In various embodiments, the orientation of scavenging seal 1300 to act upon surface 1322, perpendicular to axis 1394 of shaft 1320, possess advantages over the scavenging seals depicted in the embodiments of FIG. 11, which act upon the circumferential surface of the shaft. By operating on a surface perpendicular to shaft 1320, scavenging seal 1300 can act upon a substantially larger surface area, thereby increasing the effectiveness of the seal and allowing for larger pump channel pressures (e.g., about 26 mbar in pump channel 1312 of FIG. 13) than could be achieved in scavenging seals oriented to act upon the circumferential surface of the shaft (e.g., about 1 mbar and $1\times10^{-3}$ mbar for exhaust grooves 1136a and 1136b, respectively, in FIG. 11).

In the embodiments described above, gas bearings and scavenging seals introduce clean gases, such as nitrogen ($N_2$) along surfaces, including, but not limited to circumferential surfaces of shafts, surfaces perpendicular to surfaces of shafts, and surfaces of elongated members. However, the present invention is not limited to the use of nitrogen ($N_2$) as a lubricating gas. In additional embodiments, the gas bearings and scavenging seals of the present invention may utilize any of a number of suitable clean gases that would be apparent to one skilled in the art without departing from the sprite or scope of the present invention.

Although specific reference is made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A robot for positioning a workpiece in a vacuum, comprising:
   a first component at least partially located within a vacuum chamber and configured to position a workpiece along a translational axis, the workpiece being located within the vacuum, wherein the first component comprises:
   an elongated member configured to support the workpiece on a first end,
   an actuator configured to drive the elongated member along the translational axis to position the workpiece, and
   a first component bearing configured to act upon a surface of the elongated member during movement along the translational axis;
   a shaft configured to support the first component such that an axis of symmetry of the shaft is perpendicular to the translational axis; and
   a second component positioned outside of the vacuum chamber and configured to rotate the shaft about the axis of symmetry and move the shaft in a direction parallel to the axis of symmetry, wherein the second component comprises:
   a second component gas bearing configured to introduce gas along a circumferential surface of the shaft; and
   a scavenging seal configured to evacuate the gas introduced by the second component gas bearing.

2. The robot of claim 1, wherein the actuator is further configured to engage the elongated member at a position spatially removed from the first end.

3. The robot of claim 1, wherein the first component bearing comprises a gas bearing configured to introduce gas along the surface of the elongated member.

4. The robot of claim 3, wherein the first component further comprises a scavenging seal configured to evacuate the gas introduced by the gas bearing.

5. The robot of claim 3, wherein:
   the first component further comprises a first scavenging seal and a second scavenging seal; and
   the first and second scavenging seals are positioned, respectively, on opposite sides of the gas bearing to evacuate the gas introduced by the gas bearing.

6. The robot of claim 1, wherein the first component bearing comprises a lubricated bearing.

7. The robot of claim 6, wherein the first component further comprises a flexible bellows that encloses the elongated member to substantially reduce out-gassing of the lubricated bearing into the vacuum chamber.

8. The robot of claim 1, wherein:
   the actuator and the first component bearing are disposed within a sealed enclosure; and
   the sealed enclosure is pumped down to substantially reduce out-gassing into the vacuum chamber.

9. The robot of claim 1, wherein:
an axis of symmetry of the scavenging seal is positioned parallel to the axis of symmetry of the shaft; and
the scavenging seal is located between the second component gas bearing and the vacuum chamber.

10. The robot of claim 9, wherein the scavenging seal is configured to act upon the circumferential surface of the shaft.

11. The robot of claim 9, wherein the scavenging seal is configured to act upon a surface perpendicular to a surface of the shaft.

12. A lithographic apparatus, comprising:
an illumination system configured to produce a beam of radiation for a patterning device that is located in a vacuum chamber and configured to pattern the beam of radiation;
a projection system configured to project the patterned beam onto a target portion of a substrate within the vacuum chamber; and
a robot for positioning a workpiece within the vacuum chamber, comprising:
a first component at least partially located within the vacuum chamber and configured to position the workpiece along a translational axis, the workpiece being located within the vacuum chamber, wherein the first component comprises:
an elongated member configured to support the workpiece on a first end,
an actuator configured to drive the elongated member along the translational axis to position the workpiece, and
a first component bearing configured to act upon a surface of the elongated member during movement along the translational axis;
a shaft configured to support the first component such that an axis of symmetry of the shaft is perpendicular to the translational axis; and
a second component positioned outside of the vacuum chamber and configured to rotate the shaft about the axis of symmetry and move the shaft in a direction parallel to the axis of symmetry, wherein the second component comprises:
a second component gas bearing configured to introduce gas along a circumferential surface of the shaft; and
a scavenging seal configured to evacuate the gas introduced by the second component gas bearing.

13. The apparatus of claim 12, wherein the first component bearing comprises a gas bearing configured to introduce gas along the surface of the elongated member.

14. The apparatus of claim 13, wherein the first component further comprises a scavenging seal configured to evacuate the gas introduced by the gas bearing.

15. The apparatus of claim 13, wherein:
the first component further comprises a first scavenging seal and a second scavenging seal; and
the first and second scavenging seals are positioned, respectively, on opposite sides of the gas bearing to evacuate the gas introduced by the gas bearing.

16. The apparatus of claim 12, wherein:
the first component bearing comprises a lubricated bearing; and
the first component further comprises a flexible bellows that encloses the elongated member to substantially reduce out-gassing of the lubricated bearing into the vacuum chamber.

17. The apparatus of claim 12, wherein:
the actuator and the first component bearing are disposed within a sealed enclosure; and
the sealed enclosure is pumped down to substantially reduce out-gassing into the vacuum chamber.

18. The apparatus of claim 12, wherein:
an axis of symmetry of the scavenging seal is positioned parallel to the axis of symmetry of the shaft; and
the scavenging seal is located between the second component gas bearing and the vacuum chamber.

* * * * *